(12) United States Patent
Ohmori et al.

(10) Patent No.: US 7,372,191 B2
(45) Date of Patent: May 13, 2008

(54) MICROSWITCH AND METHOD FOR MANUFACTURING THE SAME

(75) Inventors: Makoto Ohmori, Nagoya (JP); Tatsuo Kawaguchi, Mizuho (JP)

(73) Assignee: NGK Insulators, Ltd., Nagoya (JP)

( * ) Notice: Subject to any disclaimer, the term of this patent is extended or adjusted under 35 U.S.C. 154(b) by 379 days.

(21) Appl. No.: 11/091,279

(22) Filed: Mar. 28, 2005

(65) Prior Publication Data

US 2005/0236935 A1  Oct. 27, 2005

(30) Foreign Application Priority Data

Apr. 22, 2004 (JP) .............................. 2004-126825
Mar. 1, 2005 (JP) .............................. 2005-055416

(51) Int. Cl.
*H01L 41/04* (2006.01)
(52) U.S. Cl. ...................................... 310/330; 200/181
(58) Field of Classification Search ........ 310/330–332; 200/181
See application file for complete search history.

(56) References Cited

U.S. PATENT DOCUMENTS 6,700,309 B2 * 3/2004 Dausch et al. .............. 310/330
2004/0075366 A1 * 4/2004 Mehta ........................ 310/336

FOREIGN PATENT DOCUMENTS

| JP | 07-124103 | 5/1995 |
| JP | 2001-068751 | 3/2001 |
| JP | 2003-519821 | 6/2003 |
| JP | 2003-181800 | 7/2003 |
| JP | 2003-217421 | 7/2003 |
| WO | 01/51973 | 7/2001 |

OTHER PUBLICATIONS

Proceedings of the 17th JIEP Annual Meeting (2003) 14C-10 (by Hiroki Mamiya et al., Yokohama National University).

* cited by examiner

*Primary Examiner*—J. San Martin
(74) *Attorney, Agent, or Firm*—Burr & Brown

(57) ABSTRACT

A microswitch is provided with a movable electrode contact component including a bending displacement component having a cantilever shape, a piezoelectric/electrostrictive element having a piezoelectric/electrostrictor and a voltage application electrode layers, and a substrate joined to a support portion of the movable electrode contact component and having a fixed electrode disposed on the surface thereof, wherein the piezoelectric/electrostrictive element is driven to displace the movable electrode, so that the movable electrode and the fixed electrode can be brought into a state of being electrically connected to each other or disconnected from each other. At least a thin plate of the bending displacement component is made of a ceramic material, and the thin plate, the piezoelectric/electrostrictor, and the voltage application electrode layers are integrated by firing. The microswitch can efficiently switch high-frequency signals at low power consumption and has excellent responsiveness, excellent durability, and high reliability of long term driving.

9 Claims, 14 Drawing Sheets

FIG.21(a)
FIG.21(b)
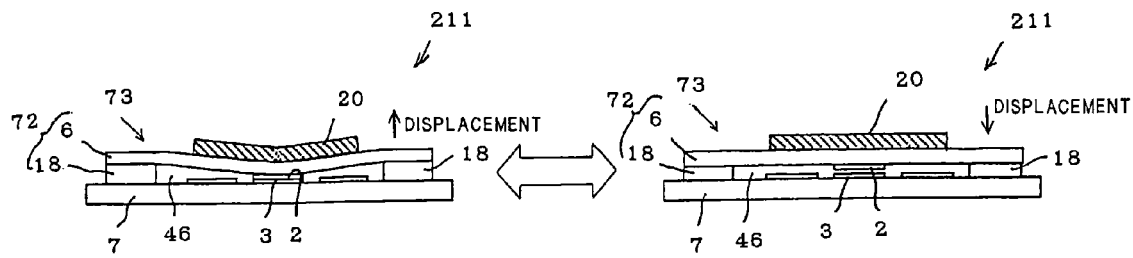
FIG.22(a)
FIG.22(b)
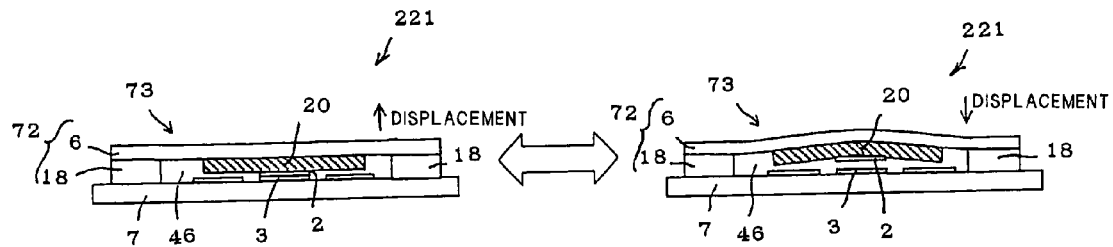
FIG.23
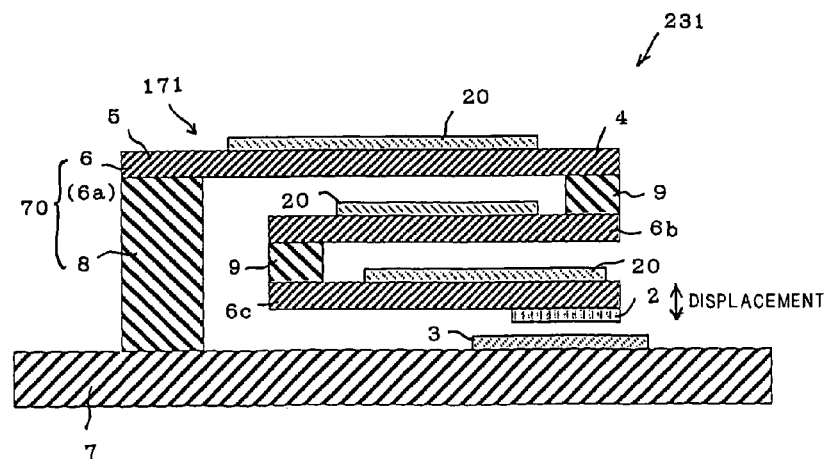

MICROSWITCH AND METHOD FOR MANUFACTURING THE SAME

BACKGROUND OF THE INVENTION

1. Field of the Invention

The present invention relates to a microswitch and a method for manufacturing the same. In particular, it relates to a microswitch useful as, for example, compact high-frequency switches for cellular phones and other portable communications equipment.

2. Description of the Related Art

In recent years, as the market for portable communications equipment and other various high-frequency equipment has been expanded and the development thereof has been expedited, the production of high-frequency electronic components to be incorporated into these equipment has been stepped up. In particular, with respect to high-frequency signal transmission and reception circuits incorporated into portable communications equipment, requirements for higher performances of compact high-frequency switches used for switching input and output signals of antennas have become even more intensified.

In particular, a high performance is required for achieving a lower insertion loss of high-frequency signal on switch-on and higher isolation on switch-off. Now, in general, the compact high-frequency switch is of a mechanical type by the use of a relay or an electronic type by the use of a PIN diode, or the like. Recently, the use of a microswitch has been studied in accordance with technological development of Micro Electro Mechanical System primarily based on a silicon process (Si-MEMS) to which a semiconductor manufacturing process is applied. Examples of advantages of the microswitch are low the insertion loss of high-frequency signal, relatively low production cost, and low power consumption, as compared with those of other electronic switches.

Examples of driving systems of the microswitch to which the above-described Si-MEMS technology is applied (hereafter referred to as "Si-MEMS switch") include an electrostatic type in which an electrostatic force serves as a driving force, a thermal type in which a component made of a bimetal is deformed by heating, a magnetic type in which a magnetic force serves as a driving force, and a piezoelectric type in which a driving force of a piezoelectric/electrostrictive element is used. Among them, the microswitch adopting the piezoelectric type driving system is noted since switching of high-frequency signals can be efficiently performed at a low power consumption as compared with those of microswitches adopting other driving systems (refer to JP-K-2003-519821, for example).

However, a Si-MEMS switch proposed in the above-described JP-k-2003-519821 and the like is to switch high-frequency signals through elastic deformation of a Si substrate and, therefore, in some cases, the reliability of long term driving is unsatisfactory. Furthermore, since a piezoelectric film and electrode films are formed on the Si substrate by a vacuum film forming process, occurrence of crack or peeling off of the films resulting from differences in thermal expansion between the Si substrate, the electrode film and the piezoelectric film must be avoided. Therefore, there is a problem in that it is difficult to increase the film thicknesses of the piezoelectric film and the electrode films.

On the other hand, a micro machine switch has been proposed as a microswitch other than the Si-MEMS switch. The micro machine switch is provided with a signal line conductor, a cantilever driven short circuit mechanism made of Cr or the like that is a material having spring characteristics, and a piezoelectric, and the short circuit mechanism is driven by the piezoelectric to displace and short-circuit the signal line conductor and a predetermined grounding conductor, so that a high-frequency signal passing through the signal line conductor is interrupted (refer to JP-A-2003-217421, for example). In addition, a piezoelectric actuator has been proposed, in which a predetermined shape of metal plate with a piezoelectric element stuck on the surface thereof is configured to be driven by bending this piezoelectric element (refer to JP-A-2001-68751, for example). Examples of methods for disposing the piezoelectric (piezoelectric element) on the surface of the metal substrate include a vacuum film forming process and a method in which a piezoelectric element prepared separately is stuck with an adhesive or the like.

However, as described above, there is a problem in that it is difficult to increase the film thicknesses of the piezoelectric element (the piezoelectric film and the electrode films) by the vacuum film forming process. In the case where the piezoelectric element is stuck to the substrate by using the adhesive, the durability of the adhesion surface and the reliability is not always satisfactory. In particular, a microswitch required to reliably switch high-frequency signals for a long term must be further improved.

SUMMARY OF THE INVENTION

The present invention was made in consideration of the above-described problems in known technologies. Accordingly, it is an object of the present invention to provide a microswitch capable of efficiently switching high-frequency signals at a low power consumption and having excellent responsiveness, excellent durability, and high reliability of long term driving, as well as a method for manufacturing the same.

In order to achieve the above-described object, the inventors of the present invention conducted intensive research. As a result, it was found out that the above-described object was able to be achieved by forming a thin plate constituting a bending displacement component from a ceramic material and integrating the thin plate, a piezoelectric/electrostrictor, and voltage application electrode layers by firing. Consequently, the present invention has been completed.

The present invention provides the following:

[1] A microswitch provided with a movable electrode contact component including a bending displacement component and a movable electrode, the bending displacement component having a thin plate and at least one support portion joined to an end portion of the above-described thin plate; a bending displacement mechanism disposed on at least one surface of the above-described thin plate and having a film piezoelectric/electrostrictor and at least one pair of voltage application electrode layers; and a substrate joined to the above-described support portion of the above-described movable electrode contact component and having a fixed electrode disposed on the surface thereof, the fixed electrode facing the above-described movable electrode, wherein the above-described bending displacement mechanism is driven to displace the above-described movable electrode, so that the above-described movable electrode and the above-described fixed electrode can be brought into a state of being electrically connected to each other or disconnected from each other, at least the above-described thin plate of the above-described bending displacement component is made of a ceramic material, and the above-described thin plate, the above-described piezoelectric/electrostrictor, and the above-described voltage application electrode layers are integrated by firing (hereafter may be referred to as "first microswitch");

[2] The microswitch according to item [1], wherein the above-described fixed electrode is composed of two fixed electrodes a and b, which are produced by splitting, and is constructed as a signal line conductor, so that the function of the microswitch is performed by bringing the above-described movable electrode and the above-described two fixed electrodes a and b into a state of being electrically connected to each other or disconnected from each other in order to bring the signal line into conduction or out of conduction;

[3] The microswitch according to item [1], wherein the above-described fixed electrode is constructed as a signal line conductor and the above-described movable electrode is constructed as a grounding conductor, so that the function of the microswitch is performed by bringing the above-described movable electrode and the above-described fixed electrode into a state of being electrically connected to each other or disconnected from each other in order to cause a short circuit between the signal line and the grounding line or not to cause a short circuit;

[4] A microswitch provided with a movable electrode component including a bending displacement component composed of a thin plate and a movable electrode; a bending displacement mechanism disposed on at least one surface of the above-described thin plate and having a film piezoelectric/electrostrictor and at least one pair of voltage application electrode layers; and a substrate joined to one end portion of the above-described thin plate of the above-described movable electrode component and having a fixed electrode disposed on the surface thereof, the fixed electrode facing the above-described movable electrode, wherein the above-described bending displacement mechanism is driven to displace the above-described movable electrode, so that the above-described movable electrode and the above-described fixed electrode can be brought into a state of being electrically connected to each other or disconnected from each other, at least the above-described thin plate of the above-described bending displacement component is made of a ceramic material, and the above-described thin plate, the above-described piezoelectric/electrostrictor, and the above-described voltage application electrode layers are integrated by firing (hereafter may be referred to as "second microswitch");

[5] The microswitch according to item [4], wherein the above-described fixed electrode and the movable electrode are constructed as signal line conductors, so that the function of the microswitch is performed by bringing the above-described movable electrode and the above-described fixed electrode into a state of being electrically connected to each other or disconnected from each other in order to bring the signal line into conduction or out of conduction;

[6] A microswitch provided with a movable electrode contact component including a bending displacement component and one pair of movable electrodes, the bending displacement component having one pair of thin plates disposed facing each other and a support portion joining one end portion of each of the above-described thin plates to each other; and a bending displacement mechanism disposed on at least one surface of each of the above-described thin plates and having a film piezoelectric/electrostrictor and at least one pair of voltage application electrode layers, wherein the above-described bending displacement mechanism is driven to displace the above-described movable electrode, so that the above-described movable electrodes can be brought into a state of being electrically connected to each other or disconnected from each other, at least the above-described thin plate of the above-described bending displacement component is made of a ceramic material, and the above-described thin plate, the above-described piezoelectric/electrostrictor, and the above-described voltage application electrode layers are integrated by firing (hereafter may be referred to as "third microswitch");

[7] The microswitch according to any one of item [1] to item [6], wherein the thickness of the above-described thin plate is 2 to 200 μm;

[8] The microswitch according to any one of item [1] to item [7], wherein the above-described thin plate contains at least one selected from the group consisting of zirconium oxide, aluminum oxide, magnesium oxide, titanium oxide, spinel, and mullite as a primary component;

[9] The microswitch according to any one of item [1] to item [8], wherein the above-described voltage application electrode layer is made of one metal selected from the group consisting of platinum, gold, silver, palladium, aluminum, titanium, chromium, iron, nickel, cobalt, copper, zinc, niobium, molybdenum, ruthenium, tantalum, tungsten, and iridium or an alloy composed of a combination of at least two of them;

[10] The microswitch according to any one of item [1] to item [8], wherein the above-described voltage application electrode layer is made of ruthenium oxide or iridium oxide;

[11] The microswitch according to any one of item [1] to item [10], wherein the above-described piezoelectric/electrostrictor is made of at least one ceramic selected from the group consisting of lead zirconate, lead titanate, lead magnesium niobate, lead nickel niobate, lead zinc niobate, lead manganese niobate, lead antimony stannate, lead manganese tungstate, lead cobalt niobate, barium titanate, sodium bismuth titanate, potassium sodium niobate, and strontium bismuth tantalate;

[12] The microswitch according to any one of item [1] to item [11], wherein the above-described bending displacement mechanism includes a plurality of the above-described voltage application electrode layers and a plurality of the above-described piezoelectric/electrostrictors which are alternately stacked so that each piezoelectric/electrostrictor is held between voltage application electrode layers;

[13] A method for manufacturing a microswitch provided with a movable electrode contact component including a bending displacement component and a movable electrode, the bending displacement component having a thin plate and at least one support portion joined to an end portion of the above-described thin plate; a bending displacement mechanism disposed on at least one surface of the above-described thin plate and having a film piezoelectric/electrostrictor and at least one pair of voltage application electrode layers; and a wiring board joined to the above-described support portion of the above-described movable electrode contact component and having a signal line electrode layer disposed on the surface thereof, the signal line electrode layer facing the above-described movable electrode, the method including the steps of stacking and firing a plurality of ceramic green sheets in a predetermined shape to produce a ceramic structure, in a first step; integrally-forming the above-described bending displacement mechanism on a predetermined surface of the above-described ceramic structure by firing to produce a bending displacement mechanism unit, in a second step; mounting the above-described movable electrode at a predetermined position to produce a movable electrode unit, in a third step; forming the above-described signal line electrode layer on an insulating substrate to prepare the above-described wiring board, in a fourth step; and mounting the above-described movable electrode unit on the above-described wiring board and eliminating unnecessary portions to produce at least one microswitch, in a fifth step; and

[14] The method for manufacturing a microswitch according to item [13], wherein the movable electrode unit is temporarily fixed to a temporary fixing substrate different from the above-described wiring board before the movable electrode unit is mounted on the wiring board in the above-described fifth step, the movable electrode unit temporarily fixed to the temporary fixing substrate is subjected to a slitting treatment in which the movable electrode unit is split without splitting the temporary fixing substrate, so that unnecessary portions are separated.

The first microswitch of the present invention is provided with a movable electrode contact component including a bending displacement component and a movable electrode, the bending displacement component having a thin plate and at least one support portion joined to an end portion of the thin plate; a bending displacement mechanism disposed on at least one surface of the thin plate and having a film piezoelectric/electrostrictor and at least one pair of voltage application electrode layers; and a substrate joined to the above-described support portion of the movable electrode contact component and having a fixed electrode disposed on the surface thereof, the fixed electrode facing the movable electrode, wherein the bending displacement mechanism is driven to displace the movable electrode, so that the movable electrode and the fixed electrode can be brought into a state of being electrically connected to each other or disconnected from each other, at least the thin plate of the bending displacement component is made of a ceramic material, and the thin plate, the piezoelectric/electrostrictor, and the voltage application electrode layers are integrated by firing. Therefore, effects are exerted on that switching of high-frequency signals can be performed efficiently at a low power consumption and that excellent responsiveness, excellent durability, and high reliability of long term driving are exhibited.

The second microswitch of the present invention is provided with a movable electrode component including a bending displacement component composed of a thin plate and a movable electrode; a bending displacement mechanism disposed on at least one surface of the thin plate and having a film piezoelectric/electrostrictor and at least one pair of voltage application electrode layers; and a substrate joined to one end portion of the thin plate of the movable electrode component and having a fixed electrode disposed on the surface thereof, the fixed electrode facing the movable electrode, wherein the bending displacement mechanism is driven to displace the movable electrode, so that the movable electrode and the fixed electrode can be brought into a state of being electrically connected to each other or disconnected from each other, at least the thin plate of the bending displacement component is made of a ceramic material, and the thin plate, the piezoelectric/electrostrictor, and the voltage application electrode layers are integrated by firing. Therefore, effects are exerted on that switching of high-frequency signals can be performed efficiently at a low power consumption and that excellent responsiveness, excellent durability, and high reliability of long term driving are exhibited. Preferably, the fixed electrode and the movable electrode are constructed as signal line conductors and, thereby, a split wiring type switch having a configuration including a signal line can be produced. Consequently, the switch can be made more compact and has excellent mountability.

The third microswitch of the present invention is provided with a movable electrode contact component including a bending displacement component and one pair of movable electrodes, the bending displacement component having one pair of thin plates disposed facing each other and a support portion joining one end portion of each of the thin plates to each other; and a bending displacement mechanism disposed on at least one surface of each of the thin plates and having a film piezoelectric/electrostrictor and at least one pair of voltage application electrode layers, wherein the bending displacement mechanism is driven to displace the movable electrodes, so that the movable electrodes can be brought into a state of being electrically connected to each other or disconnected from each other, at least the thin plate of the bending displacement component is made of a ceramic material, and the thin plate, the piezoelectric/electrostrictor, and the voltage application electrode layers are integrated by firing. Therefore, effects are exerted on that switching of high-frequency signals can be performed efficiently at a low power consumption and that excellent responsiveness, excellent durability, and high reliability of long term driving are exhibited.

According to the method for manufacturing a microswitch of the present invention, the microswitch of the present invention capable of efficiently switching high-frequency signals at a low power consumption and having excellent responsiveness, excellent durability, and high reliability of long term driving can be efficiently and simply produced.

BRIEF DESCRIPTION OF THE DRAWINGS

FIGS. 2(a) and (b) show a sectional view schematically showing an embodiment of the first microswitch of the present invention wherein FIG. 2(a) shows a state before displacement and FIG. 2(b) shows a state that the displacement occurs.

FIGS. 4(a) and (b) show a sectional view schematically showing a driving state in another embodiment of the first microswitch of the present invention wherein FIG. 4(a) shows a state before displacement and FIG. 4(b) shows a state that the displacement occurs.

FIGS. 5(a) and (b) show a sectional view schematically showing a driving state in another embodiment of the first microswitch of the present invention wherein FIG. 5(a) shows a state before displacement and FIG. 5(b) shows a state that the displacement occurs.

FIGS. 6(a) and (b) show a sectional view schematically showing a driving state in another embodiment of the first microswitch of the present invention wherein FIG. 6(a) shows a state before displacement and FIG. 6(b) shows a state that the displacement occurs.

FIGS. 8(a) and (b) show a sectional view schematically showing an embodiment of the third microswitch of the present invention wherein FIG. 8(a) shows a state before displacement and FIG. 8(b) shows a state that the displacement occurs.

FIG. 21(a) shows schematically a sectional view of a state before driving and FIG. 21(b) shows a driving state of a microswitch which corresponds to an embodiment of the first microswitch of the present invention and in which a bending displacement component having cavity shape is constructed.

FIG. 22(a) shows schematically a sectional view of a state before driving and FIG. 22(b) shows a driving state of a microswitch which corresponds to an embodiment of the first microswitch of the present invention and in which a bending displacement component having cavity shape is constructed.

FIG. 23 is a sectional view schematically showing an action of a microswitch which corresponds to an embodiment of the first microswitch of the present invention and which is provided with a displacement accumulation mechanism. The following numerical references used in the above-mentioned figures denote the portion(s), part(s) and/or element(s), respectively:

1, 10, 104, 105, 106, 170, 201, 211, 221, 231 . . . microswitch, 2a, 2b, 2 . . . movable electrode, 3a, 3b, 3 . . . fixed electrode, 4, 44 . . . front-end portion, 5, 55 . . . rear end portion, 6, 6a, 6b, 6c, 10a, 10b . . . thin plate, 7 . . . substrate, 8, 18 . . . supporting portion, 9 . . . joint portion, 12 . . . movable electrode, 15 . . . dielectric, 16 . . . ceramic substrate, 20, 30 . . . piezoelectric/electrostrictive element, 21, 22 . . . terminal, 23a, 23b, 23c, 23d . . . voltage application electrode layer, 25a, 25b, 25c . . . piezoelectric/electrostrictor, 46 . . . cavity, 50A, 50B, 52A . . . ceramic green sheet, 54 . . . window portion, 58 . . . ceramic green sheet laminate, 60 . . . ceramic structure, 61 . . . temporary fixing substrate, 62 . . . temporary fixing adhesive layer, 63 . . . adhesive layer, 64a, 64b, 64c, 64d . . . unnecessary portions, 65 . . . sealing substrate, 66, 67 . . . microswitch precursor, 70, 72, 75, 77 . . . bending displacement component, 71, 73, 76 . . . movable electrode contact component, 78 . . . movable electrode component, 80 . . . bending displacement mechanism unit, 85 . . . movable electrode unit, 86 . . . insulating substrate, 90 . . . wiring board, 92 . . . wire bonding, 93a, 93b, 93c, 93 . . . piezoelectric/electrostrictive element driving electrode, 94 . . . bottom surface side of wiring board, 95 . . . fixed electrode, 103 . . . fixed electrode, 171 . . . movable electrode contact component, A . . . film thickness of piezoelectric/electrostrictive element, B . . . thickness of the thin plate, C . . . length of the thin plate, C1~C7 . . . cutting-plane line, S1~S4, S . . . cut-in line.

DESCRIPTION OF THE PREFERRED EMBODIMENTS

The preferred embodiments of the present invention will be described below. However, the present invention is not limited to the following embodiments. It must be understood that changes in the design, improvements, and the like within the scope of the present invention can be appropriately made based on the general knowledge of a person skilled in the art. Hereafter, a simple expression "microswitch of the present invention" refers to each of the first microswitch, the second microswitch, and the third microswitch.

Figure 1:
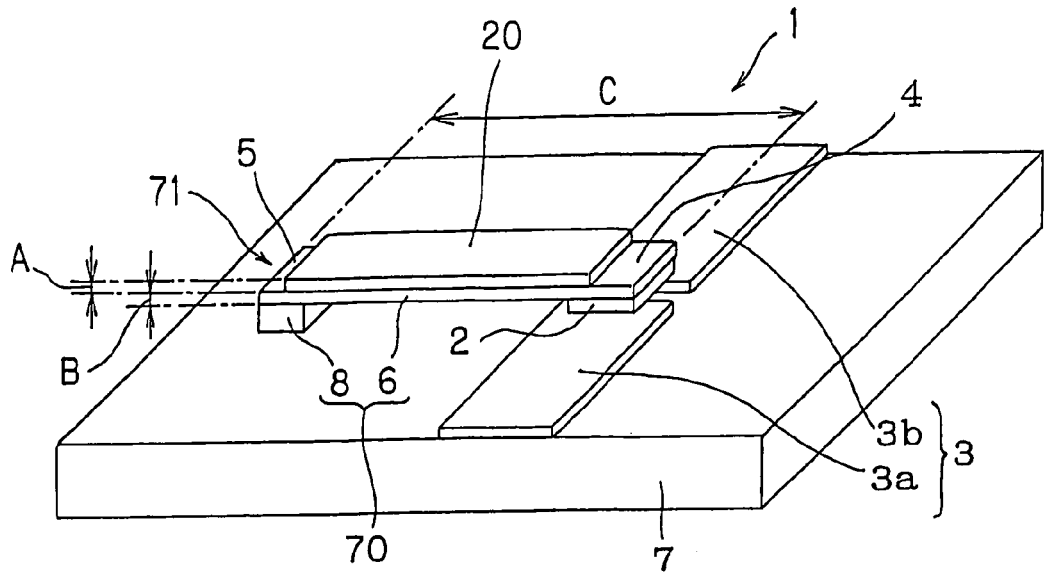
FIG. 1 is a perspective view schematically showing an embodiment of the first microswitch of the present invention.
Figure 2A:
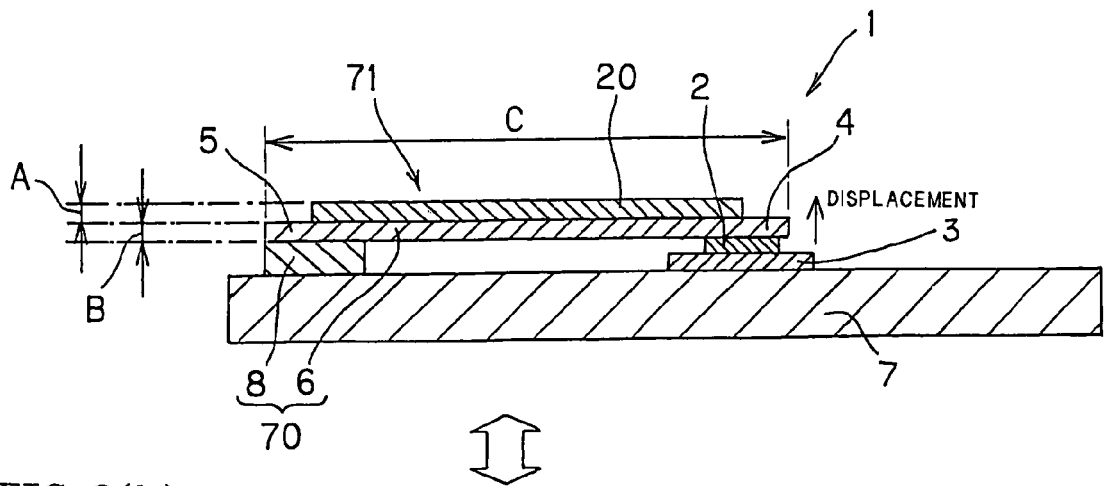

FIG. 1 is a perspective view schematically showing an embodiment of the first microswitch of the present invention. FIGS. 2(a) and (b) are a sectional view schematically showing an embodiment of the first microswitch of the present invention. As shown in FIG. 1 and FIGS. 2(a) and (b), a microswitch 1 of the present embodiment is provided with a movable electrode contact component 71 including a bending displacement component 70 and a movable electrode 2, a piezoelectric/electrostrictive element 20 disposed on the surface of a thin plate 6, and a substrate 7 joined to a support portion 8 of the movable electrode contact component 71 and having a fixed electrode 3 (fixed electrodes 3a and 3b) disposed on the surface thereof, the fixed electrode facing the movable electrode 2 and being formed with an arbitrary pattern. The bending displacement component 70 is composed of the thin plate 6 and the support portion 8 disposed on the rear-end portion 5 of the thin plate 6, and is a component having a so-called cantilever shape. Although not specifically shown in the drawing, the piezoelectric/ electrostrictive element 20 is a bending displacement mechanism provided with at least one piezoelectric/electrostrictor and at least one pair of voltage application electrode layers to apply a voltage to this piezoelectric/electrostrictor, and is a mechanism (element) for effecting mutual conversion between electrical energy and mechanical energy.

Figure 2B:
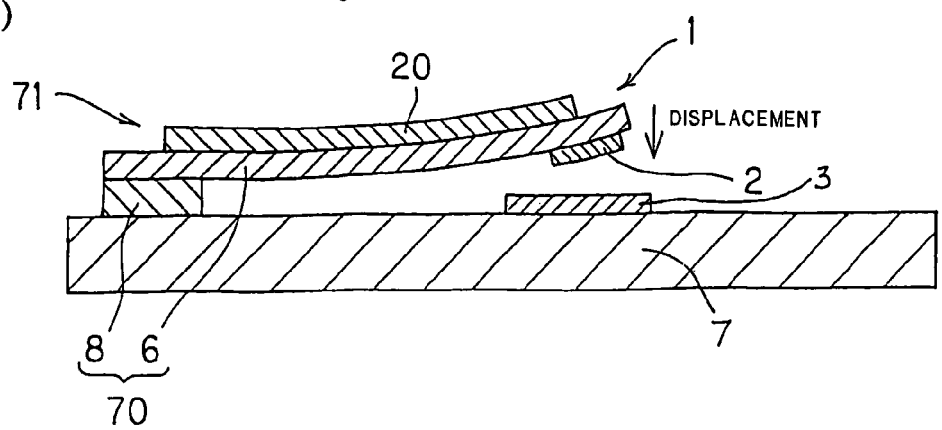

The front-end portion 4 of the thin plate 6 is provided with the movable electrode 2, and can be displaced in the thickness direction of the thin plate 6. The fixed electrode 3 disposed on the substrate 7 is arranged to face the movable electrode 2. It is desirable that a coplanar structure (CPW) suitable for switching of high-frequency signals is adopted as the structure of the fixed electrode 3. Here, the piezoelectric/electrostrictive element 20 is disposed on the surface of the thin plate 6, and is an element capable of being driven to displace the front-end portion 4 of the thin plate 6 based on the piezoelectric effect thereof. Therefore, as shown in FIG. 2, the microswitch 1 of the present embodiment can bring the movable electrode 2 and the fixed electrodes 3*a* and 3*b* into a state of being electrically connected to each other or disconnected from each other by driving the piezoelectric/electrostrictive element 20.

In the microswitch 1 (refer to FIG. 1) of the present embodiment, at least the thin plate 6 of the bending displacement component 70 is composed of a ceramic material. The piezoelectric/electrostrictor and the voltage application electrode layers constituting the piezoelectric/electrostrictive element 20 are formed into the shape of a film on the thin plate 6 by a thick film forming method, e.g., a screen printing method, a dipping method, a coating method, or an electrophoresis method, which will be described below, and are fired so as to be disposed while being integrated with the thin plate 6. Since the piezoelectric/electrostrictive element 20 disposed by using such a thick film forming method is integrated with the thin plate 6 without using any adhesive, the piezoelectric/electrostrictive element 20 has excellent adhesion to the thin plate 6 and exhibits extremely high durability and extremely high reliability of long term driving.

Many fine holes are present in a piezoelectric/electrostrictive layer produced by firing a film made of a piezoelectric/electrostrictive material and formed by the thick film forming method, e.g., the screen printing method. Since occurrence of cracks after the firing is effectively suppressed due to the presence of the above-described holes, the microswitch 1 of the present embodiment has high reliability, wherein the piezoelectric/electrostrictive element 20 has no problem, e.g., crack. Furthermore, since many fine holes are present in the piezoelectric/electrostrictive layer, it is expected that the effect of relieving the stress which occurs at an interface of each layer is exerted during the driving of the piezoelectric/electrostrictive element 20.

In the first microswitch of the present invention, although not specifically shown in the drawing, a bending displacement component having so-called center impeller shape may be constructed, in which two supports are disposed at both ends of the thin plate while being kept separated from each other, and the movable electrode may be disposed in the neighborhood of the central portion of the thin plate. That is, even when such a bending displacement component having a center impeller shape is constructed, the movable electrode and the fixed electrode can be brought into a state of being electrically connected to each other or disconnected from each other by driving the piezoelectric/electrostrictive element. Alternatively, four support portions may be disposed at four corners of the thin plate while being kept separated from each other, and the number of support portion is not specifically limited.

In the first microswitch of the present invention, a bending displacement component having a so-called cavity shape may be constructed, in which four faces are confined. FIGS. 21(*a*) and (*b*) and FIGS. 22(*a*) and (*b*) are sectional views schematically showing actions of microswitches which correspond to embodiments of the first microswitch of the present invention and in which bending displacement components having a cavity shape are constructed. As shown in FIGS. 21(*a*) and (*b*), a microswitch 211 of the present embodiment is provided with a movable electrode contact component 73 including a bending displacement component 72 and a movable electrode 2, a piezoelectric/electrostrictive element 20 disposed on the surface of a thin plate 6, and a substrate 7 joined to a support portion 18 of the movable electrode contact component 73 and having a fixed electrode 3 disposed on the surface thereof, the fixed electrode facing the movable electrode 2 and being formed with an arbitrary pattern. The bending displacement component 72 is a component having a cavity shape composed of the thin plate 6 and the sheet-shaped support portion 18 partitioning a space between the thin plate 6 and the substrate 7 to form a cavity 46. Although not specifically shown in the drawing, the piezoelectric/electrostrictive element 20 is a bending displacement mechanism provided with at least one piezoelectric/electrostrictor and at least one pair of voltage application electrode layers to apply a voltage to this piezoelectric/ electrostrictor, and is a mechanism (element) for effecting mutual conversion between electrical energy and mechanical energy. The thin plate 6 provided with the movable electrode 2 can be displaced in the thickness direction of the thin plate 6 (refer to FIG. 21(*a*)). The fixed electrode 3 disposed on the substrate 7 is arranged to face the movable electrode 2. The piezoelectric/electrostrictive element 20 is disposed on the surface opposite to the cavity 46 of the thin plate 6, and is an element capable of being driven to displace the thin plate 6 based on the piezoelectric effect thereof. Therefore, as shown in FIG. 21(*a*), the microswitch 211 of the present embodiment can bring the movable electrode 2 and the fixed electrode 3 into a state of being electrically connected to each other or disconnected from each other by driving the piezoelectric/electrostrictive element 20. The microswitch 221 of the present embodiment shown in FIGS. 22(*a*) and (*b*) are similar to the microswitch 211 but is different from the microswitch 211 in that the piezoelectric/ electrostrictive element 20 is disposed on the surface in the cavity 46 side of the thin plate 6 (explanations is omitted).

The first microswitch of the present invention may be provided with a displacement accumulation mechanism. FIG. 23 is a sectional view schematically showing an action of a microswitch which corresponds to an embodiment of the first microswitch of the present invention and which is provided with the displacement accumulation mechanism. In the case where the bending displacement mechanism is composed of the piezoelectric/electrostrictive element, the quantity of displacement is proportionate to the length of the piezoelectric/electrostrictive element. Therefore, the length of the piezoelectric/electrostrictive element must be increased in order to realize a large displacement. Undesirably, this leads to upsizing of the microswitch. Consequently, in order to produce a microswitch capable of realizing a large displacement in spite of being compact, some contrivance is required, for example, the thin plate to be provided with the piezoelectric/electrostrictive element (bending displacement mechanism) is folded back.

Examples of known prior arts on such contrivance include JP-A-2003-181800, Japanese Patent No. 3388834, and Proceedings of the 17th JIEP Annual Meeting ((2003) 14C-10, Author: Hiroki Mamiya et al., Yokohama National University).

The microswitch 231 of the present embodiment shown in FIG. 23 is provided with a movable electrode contact component 171 including a bending displacement component 70 and a movable electrode 2, a piezoelectric/electrostrictive element 20 disposed on the surface of a thin plate 6(6*a*), and a substrate 7 joined to a support portion 8 of the movable electrode contact component 171 and having a fixed electrode 3 disposed on the surface thereof, the fixed electrode facing the movable electrode 2 and being formed with an arbitrary pattern. The bending displacement component 70 is composed of the thin plate 6(6*a*) and the support portion 8 disposed on the rear-end portion 5 of the thin plate 6, and is a component having so-called cantilever shape. The microswitch 231 of the present embodiment is characterized in that the movable electrode contact component 171 includes a second thin plate 6*b* disposed in the manner of folding back via a joint portion 9 joined to the front-end portion 4 of the thin plate 6(6*a*) (refer to FIG. 23), and furthermore, a third thin plate 6*c* disposed in the manner of folding back again via another joint portion 9 joined to the thin plate 6*b* (refer to FIG. 23). In the microswitch 231 of the present embodiment, a piezoelectric/electrostrictive element 20 is also disposed on each of the thin plates 6*b* and 6*c*, and (as described above) the movable electrode 2 is disposed on the thin plate 6*c* while facing the fixed electrode 3. Each of the three piezoelectric/electrostrictive elements 20 is a bending displacement mechanism provided with at least one piezoelectric/electrostrictor and at least one pair of voltage application electrode layers to apply a voltage to this piezoelectric/electrostrictor, and is a mechanism (element) for effecting mutual conversion between electrical energy and mechanical energy. Each of the thin plates 6(6*a*), 6*b*, and 6*c* can be displaced in the thickness direction of the thin plate 6 by each of the piezoelectric/electrostrictive elements 20 which is disposed respectively and is driven based on the piezoelectric effect thereof. The microswitch 231 of the present embodiment can bring the movable electrode 2 and the fixed electrode 3 into a state of being electrically connected to each other or disconnected from each other by driving the three piezoelectric/electrostrictive elements 20.

Figure 4A:
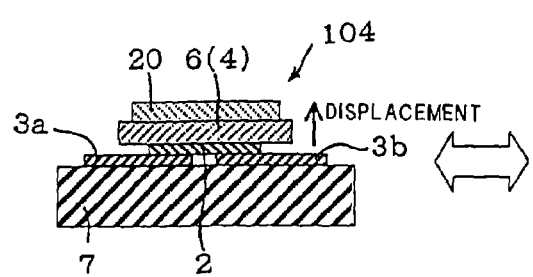
Figure 4B:
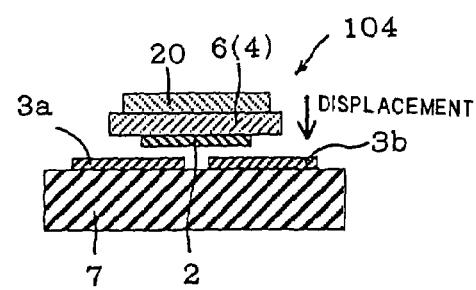
Figure 18:
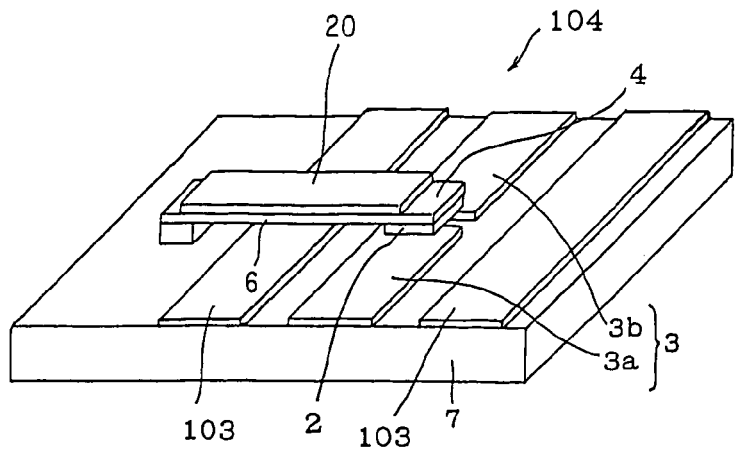
FIG. 18 is a perspective view schematically showing another embodiment of the first microswitch of the present invention.

Next, a driving state of the first microswitch of the present invention will be described. In the following description, the case where a bending displacement component having a cantilever shape is used is primarily exemplified. FIG. 18 is a perspective view schematically showing another embodiment of the first microswitch of the present invention. FIGS. 4(*a*) and (*b*) are a sectional view schematically showing a driving state in the embodiment shown in FIG. 18 of the first microswitch of the present invention. In FIGS. 4(*a*) and (*b*), fixed electrodes 3*a* and 3*b* constructed as a two-part split signal line conductor (corresponding to the fixed electrode a and the fixed electrode b in the above-described embodiment of the first microswitch of the present invention) and a fixed electrodes 103 (GND) constructed as grounding conductors are disposed on the substrate 7 constituting the microswitch 104, and a state in which the movable electrode 2 and the fixed electrodes 3*a* and 3*b* are in contact with each other (FIG. 4(*a*)) and a state in which these are not in contact with each other are repeated in accordance with the displacement (FIG. 4(*b*)) (displacement in a vertical direction as is shown in FIG. 4(*b*)) of the front-end portion 4 of a thin plate 6. When the movable electrode 2 and the fixed electrodes 3*a* and 3*b* are in contact with each other, the signal line is brought into conduction from one fixed electrode (for example, fixed electrode 3*a*) to the other fixed electrode (for example, fixed electrode 3*b*) via the movable electrode 2. On the other hand, when the movable electrode 2 and the fixed electrodes 3*a* and 3*b* are not in contact with each other, the signal line is interrupted.

Figure 5A:
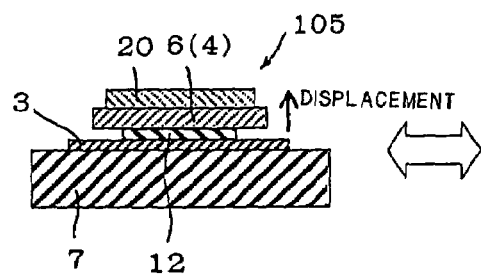
Figure 5B:
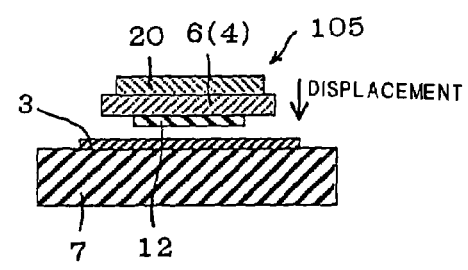
Figure 19:
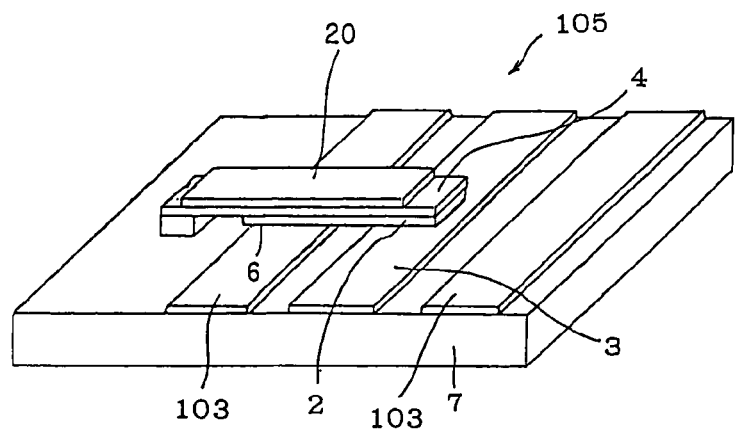
FIG. 19 is a perspective view schematically showing another embodiment of the first microswitch of the present invention.

FIG. 19 is a perspective view schematically showing another embodiment of the first microswitch of the present invention. FIGS. 5(*a*) and (*b*) are a sectional view schematically showing a driving state in the embodiment shown in FIG. 19 of the first microswitch of the present invention. In FIGS. 5(*a*) and (*b*), one fixed electrode 3 constructed as a signal line conductor and a fixed electrode 103 (GND) constructed as a grounding conductor are disposed on a substrate 7 constituting a microswitch 105, and a state in which a movable electrode 12, the fixed electrode 3, and the fixed electrode 103 (GND) are in contact with each other (FIG. 5(*a*)) and a state in which these are not in contact with each other are repeated in accordance with the displacement (FIG. 5(*b*)) (displacement in a vertical direction as is shown in FIG. 5(*b*)) of the front-end portion 4 of a thin plate 6. When the movable electrode 12, the fixed electrode 3, and the fixed electrode 103 (GND) are not in contact with each other, the signal line is disconnected from the grounding conductor, and the signal passes through the fixed electrode 3. On the other hand, when the movable electrode 12, the fixed electrode 3, and the fixed electrode 103 (GND) are in contact with each other, the signal line is connected to the movable electrode 12, and furthermore, is connected to the fixed electrode 103 (GND) serving as a ground conductor, so that the signal passes from the fixed electrode 3 to the fixed electrode 103 (GND) via the movable electrode 12 through short-circuiting. Therefore, since the signal line can be interrupted by a physical action, short-circuiting, the leakage of, for example, high-frequency signals to the outside can be effectively interrupted.

The above-described embodiments (microswitches 104 and 105) of the first microswitch of the present invention have an advantage in that the movable electrode is small. This is because if the movable electrode becomes large, the electrostatic force exerted between a fine gap and other effects cannot be neglected, the movable electrode and the fixed electrode may be kept in contact with each other due to the electrostatic force and the like, and the function as a switch may not be performed. For example, with respect to known Si-MEMS switches and the like by using the electrostatic force, there is a known problem (sticking) in that the switch becomes unable to function against the electrostatic force exerted between electrodes. However, according to the embodiments of the first microswitch of the present invention, such a problem is resistant to occurrence. With respect to known piezoelectric actuators in which piezoelectric elements are stuck to metal plates (for example, JP-A-2001-68751) and Si-MEMS switches in which piezoelectric films and electrode films are formed on Si substrates by a vacuum film forming process, there is a limit of downsizing of movable electrodes since fine processing is difficult. In the embodiments of the first microswitch of the present invention, the piezoelectric/electrostrictive element (bending displacement mechanism composed of a piezoelectric/electrostrictor and voltage application electrode layers) integrated with the thin plate by firing has adequate rigidity. Therefore, the piezoelectric/electrostrictive element including the movable electrode can be fine-processed. The embodiments of the first microswitch of the present invention are advantageous as compared with known technologies in this point.

Figure 6A:
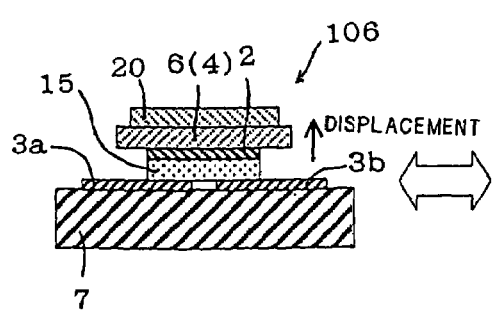
Figure 6B:
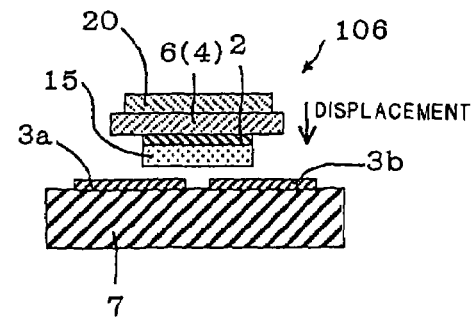

FIGS. 6(a) and (b) are a sectional view schematically showing a driving state in another embodiment of the first microswitch of the present invention. A microswitch 106 of the present embodiment is a so-called capacitive coupling type microswitch in which an actuator is driven to bring the movable electrode 2 and the fixed electrodes 3a and 3b close to each other, the capacitance between the two electrodes is increased and, thereby, alternating current signals are transmitted. FIGS. 6(a) and (b) shows a state in which fixed electrodes 3a and 3b, which have been split into two parts, are disposed on the substrate 7 constituting the microswitch 106, and a dielectric 15 is disposed on the surface of the movable electrode 2. In addition, a state in which the movable electrode 2 and the fixed electrodes 3a and 3b are in contact with each other (FIG. 6(a)) and a state in which these are not in contact with each other are repeated in accordance with the displacement (FIG. 6(b)) (displacement in a vertical direction as is shown in FIG. 6(b)) of the front-end portion 4 of the thin plate 6. When the movable electrode 2 and the fixed electrodes 3a and 3b are in contact with each other via the dielectric 15 as described above, the signal line is brought into conduction, and the signals pass from one fixed electrode (for example, fixed electrode 3a) to the other fixed electrode (for example, fixed electrode 3b) via the dielectric 15. On the other hand, when the dielectric 15 and the fixed electrodes 3a and 3b are not in contact with each other, the signal line is interrupted. FIGS. 6(a) and (b) show the state in which the dielectric 15 is disposed on the surface of the movable electrode 2. However, the dielectric may be disposed on the surfaces of the fixed electrodes 3a and 3b.

Figure 20A:
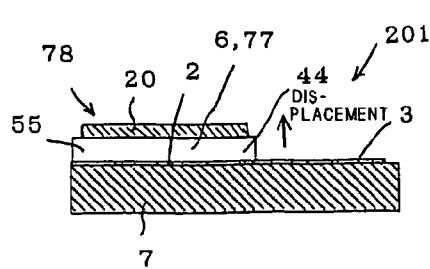
FIG. 20(a) shows schematically a sectional view of a state before driving and FIG. 20(b) shows a driving state in an embodiment of the second microswitch of the present invention.

The embodiments of the second microswitch of the present invention will be described below. FIGS. 20(a) and (b) are a sectional view schematically showing a driving state in an embodiment of the second microswitch of the present invention. As shown in FIGS. 20(a) and (b), a microswitch 201 of the present embodiment is provided with a movable electrode component 78 including a bending displacement component 77, which is composed of a thin plate 6, and a movable electrode 2, a piezoelectric/electrostrictive element 20 disposed on the surface of the thin plate 6, and a substrate 7 joined to one end portion of the thin plate 6 of the movable electrode component 78 and having a fixed electrode 3 disposed on the surface thereof, the fixed electrode 3 facing the movable electrode 2 and being formed with an arbitrary pattern. Although not specifically shown in the drawing, the piezoelectric/electrostrictive element 20 is a bending displacement mechanism provided with at least one piezoelectric/electrostrictor and at least one pair of voltage application electrode layers to apply a voltage to this piezoelectric/electrostrictor, and is a mechanism (element) for effecting mutual conversion between electrical energy and mechanical energy.

Figure 20B:
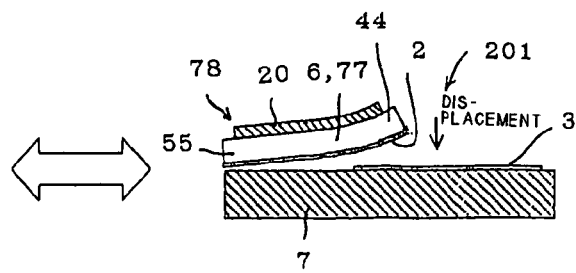

The thin plate 6 is provided with the movable electrode 2 on the surface opposite to the surface provided with the piezoelectric/electrostrictive element 20. The front-end portion 44 on the side opposite to the rear end portion joined to the substrate 7 can be displaced in the thickness direction of the thin plate 6. The fixed electrode 3 disposed on the substrate 7 is arranged to face the movable electrode 2. It is desirable that a coplanar structure (CPW) suitable for switching of high-frequency signals is adopted as the structure of the fixed electrode 3. Here, the piezoelectric/electrostrictive element 20 is disposed on the surface of the thin plate 6, and is an element capable of being driven to displace the above-described front-end portion 44 of the thin plate 6 based on the piezoelectric effect thereof. Therefore, as shown in FIG. 20(b), the microswitch 201 of the present embodiment can bring the movable electrode 2 and the fixed electrodes 3 into a state of being electrically connected to each other or disconnected from each other by driving the piezoelectric/electrostrictive element 20. The microswitch 201 of the present embodiment is different from the above-described embodiment of the first microswitch of the present invention in that the movable electrode 2 is constructed as a signal line conductor. Since this movable electrode 2 and the fixed electrode 3 are constructed as signal line conductors, when the movable electrode 2 and the fixed electrode 3 are in contact with each other, the signal line is brought into conduction. On the other hand, when the movable electrode 2 and the fixed electrodes 3 are not in contact with each other, the signal line is interrupted.

In the microswitch 201 of the present embodiment, thin plate 6 constituting the bending displacement component 77 is composed of a ceramic material. The piezoelectric/electrostrictor and the voltage application electrode layers constituting the piezoelectric/electrostrictive element 20 are formed into the shape of a film on the thin plate 6 by a thick film forming method, e.g., a screen printing method, a dipping method, a coating method, or an electrophoresis method, which will be described below, and are fired so as to be disposed while being integrated with the thin plate 6. Since the piezoelectric/electrostrictive element 20 disposed by using such a thick film forming method is integrated with the thin plate 6 without using any adhesive, the piezoelectric/electrostrictive element 20 has excellent adhesion to the thin plate 6 and exhibits extremely high durability and extremely high reliability of long term driving.

Many fine holes are present in a piezoelectric/electrostrictive layer produced by firing a film made of a piezoelectric/electrostrictive material and formed by the thick film forming method, e.g., the screen printing method. Since occurrence of cracks after the firing is effectively suppressed due to the presence of the above-described holes, the microswitch 201 of the present embodiment has high reliability, wherein the piezoelectric/electrostrictive element 20 has no problem, e.g., crack. Furthermore, since many fine holes are present in the piezoelectric/electrostrictive layer, it is expected that the effect of relieving the stress which occurs at an interface of each layer is exerted during the driving of the piezoelectric/electrostrictive element 20.

Figure 7:
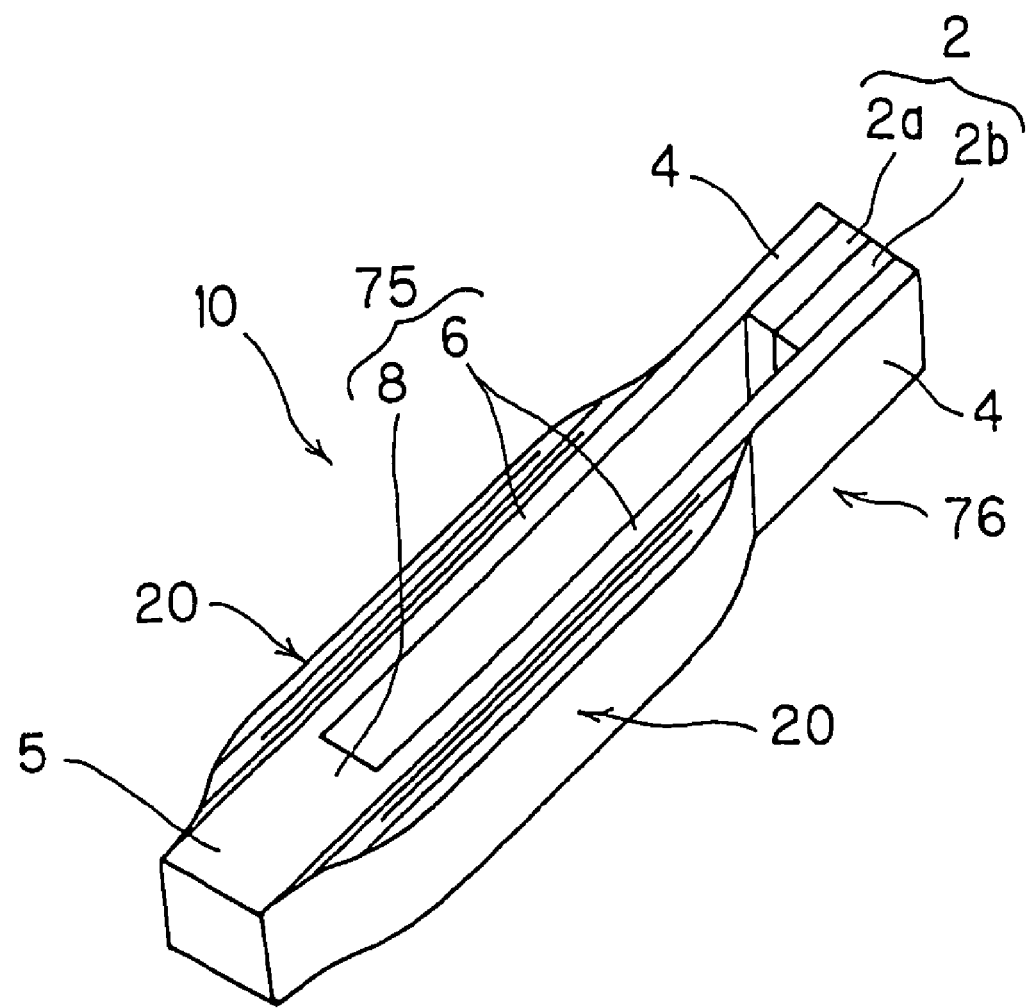
FIG. 7 is a perspective view schematically showing an embodiment of the third microswitch of the present invention.
Figure 8A:
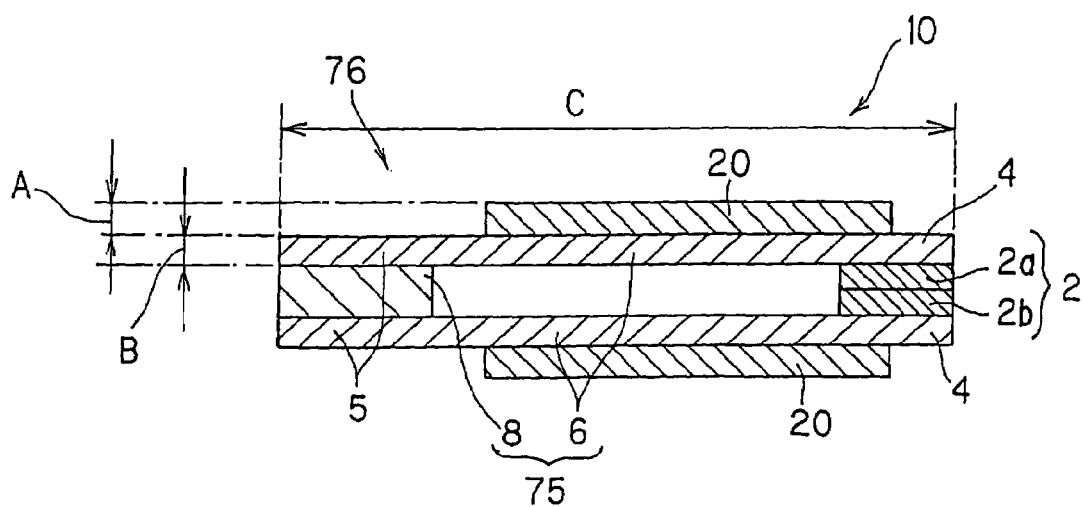

The embodiments of the third microswitch of the present invention will be described below. FIG. 7 is a perspective view schematically showing an embodiment of the third microswitch of the present invention. FIGS. 8(a) and (b) are a sectional view schematically showing an embodiment of the third microswitch of the present invention. As shown in FIG. 7 and FIGS. 8(a) and (b), the microswitch 10 of the present invention is provided with a movable electrode contact component 76 including a bending displacement component 75 and a pair of movable electrodes 2a and 2b and a piezoelectric/electrostrictive element 20 disposed each surface of a thin plate 6. The bending displacement component 75 is composed of one pair of the thin plates 6 disposed facing each other and a support portion 8 joining one end portion (rear end portion 5) of each of the thin plates to each other, and is a so-called U-shaped component. The piezoelectric/electrostrictive element 20 is a bending displacement mechanism provided with at least one piezoelectric/electrostrictor and at least one pair of voltage application electrode layers to apply a voltage to this piezoelectric/ electrostrictor, and is a mechanism (element) for effecting mutual conversion between electrical energy and mechanical energy.

The front-end portion 4 of each of the thin plates 6 provided with the movable electrodes 2a and 2b can be displaced in the thickness direction of the thin plate 6, that is, in the direction in which the distance between the thin plates 6 is increased. Here, the piezoelectric/electrostrictive element 20 is disposed on the surface of each thin plate 6, and is an element capable of being driven to displace the front-end portion 4 of the thin plate 6 based on the piezoelectric effect thereof. Therefore, as shown in FIGS. 8(a) and (b), the microswitch 10 of the present embodiment can bring the movable electrodes 2a and the movable electrode 2b into a state of being electrically connected to each other or disconnected from each other by driving the piezoelectric/electrostrictive elements 20. It is also preferable that a dielectric is disposed on the surface of at least one of the movable electrodes 2a and 2b, and the movable electrode 2a and the movable electrode 2b are electrically connected to each other via the dielectric, as in the above-described first microswitch.

FIG. 7 and FIGS. 8(a) and (b) show the microswitch 10 in the state in which the front-end portions 4 of thin plates 6 are provided with a movable electrode 2a and a movable electrode 2b, respectively, while the movable electrode 2a is the same as the movable electrode 2b. However, in the present invention, the manner of disposition of the movable electrodes is not limited to this. For example, one of the movable electrodes 2a and 2b may be constructed as a grounding conductor, the other may be constructed as a signal line conductor, and the signal line may be configured to be interrupted by bringing the two into contact with each other; that is, short-circuiting the two. Furthermore, the number of movable electrodes disposed on one front-end portion can be arbitrarily set.

In the microswitch 10 of the present embodiment, at least the thin plate 6 of the bending displacement component 75 is composed of a ceramic material. The piezoelectric/electrostrictor and the voltage application electrode layers constituting the piezoelectric/electrostrictive element 20 are formed into the shape of a film on the thin plate 6 by a thick film forming method, e.g., a screen printing method, a dipping method, a coating method, or an electrophoresis method, which will be described below, and are fired so as to be disposed while being integrated with the thin plate 6. Since the piezoelectric/electrostrictive element 20 disposed by using such a thick film forming method is integrated with the thin plate 6 without using any adhesive, the piezoelectric/electrostrictive element 20 has excellent adhesion to the thin plate 6 and exhibits extremely high durability and extremely high reliability of long term driving.

Many fine holes are present in a piezoelectric/electrostrictive layer produced by firing a film made of a piezoelectric/electrostrictive material and formed by the thick film forming method, e.g., the screen printing method. Since occurrence of cracks after the firing is effectively suppressed due to the presence of the above-described holes, the microswitch 10 of the present embodiment has high reliability, wherein the piezoelectric/electrostrictive element 20 has no problem, e.g., crack. Furthermore, since many fine holes are present in the piezoelectric/electrostrictive layer, it is expected that the effect of relieving the stress which occurs at an interface of each layer is exerted during the driving of the piezoelectric/electrostrictive element 20.

In the embodiments of the microswitch of the present invention, preferably, the film thickness A (refer to FIG. 2(a) and FIG. 8(a)) of the piezoelectric/electrostrictive element is within the range of 2 to 200 µm, more preferably is 10 to 150 µm, and 20 to 100 µm is particularly preferable. That is, the film thickness is adequately large as compared with the film thickness of a piezoelectric/electrostrictive element constituting a known microswitch. Therefore, a microswitch having excellent durability and a large driving force and exhibiting low power consumption and excellent responsiveness can be produced. If the film thickness of the piezoelectric/electrostrictive element is less than 2 µm, when the thick film forming method is adopted, it may become difficult to prepare a piezoelectric/electrostrictive element having a multilayer structure in practice. On the other hand, if the film thickness of the piezoelectric/electrostrictive element exceeds 200 µm, the displacement of the thin plate may be restricted. Here, a term "film thickness of piezoelectric/electrostrictive element" in the present specification refers to an average film thickness of the piezoelectric/electrostrictive element, and when the piezoelectric/electrostrictive element is constructed by stacking a plurality of piezoelectric/electrostrictors and a plurality of voltage application electrode layers, it refers to an average value of distances (thicknesses) from the end surface of the lowermost layer to the end surface of the uppermost layer.

In the embodiments of the microswitch of the present invention, preferably, the thickness B (refer to FIG. 2(a) and FIG. 8(a)) of the thin plate is 2 to 200 µm, more preferably is 10 to 100 µm, and 15 to 80 µm is particularly preferable. Most preferably, the thickness B is 20 to 60 µm. If the thickness B of the thin plate is less than 2 µm, the thin plate may be damaged during processing, and it may be difficult to horizontally fire the thin plate in the ceramic firing. On the other hand, if the thickness B of the thin plate exceeds 200 µm, the displacement of the thin plate by piezoelectric driving may be suppressed. Therefore, a crack-free switch having excellent reliability for a long term and capable of being driven at a low electric power can be provided by specifying the thickness B of the thin plate to take on a numerical value within the above-described range.

In the embodiments of the microswitch of the present invention, preferably, the length from the rear-end portion of the thin plate to the front-end portion (length C (refer to FIG. 2(a) and FIG. 8(a)) of the thin plate) is 0.2 to 10 mm, more preferably is 0.3 to 6 mm, and 0.5 to 3 mm is particularly preferable. If the length C of the thin plate is less than 0.2 mm, any displacement adequate for effecting switching may not be attained. On the other hand, if the length C of the thin plate exceeds 10 mm, the resonant frequency of the cantilever may be reduced. Therefore, an actuator which exhibits the quantity of displacement adequate for effecting switching and having a resonant frequency suitable for high-speed switching can be provided by specifying the length C of the thin plate to take on a numerical value within the above-described range.

Figure 3:
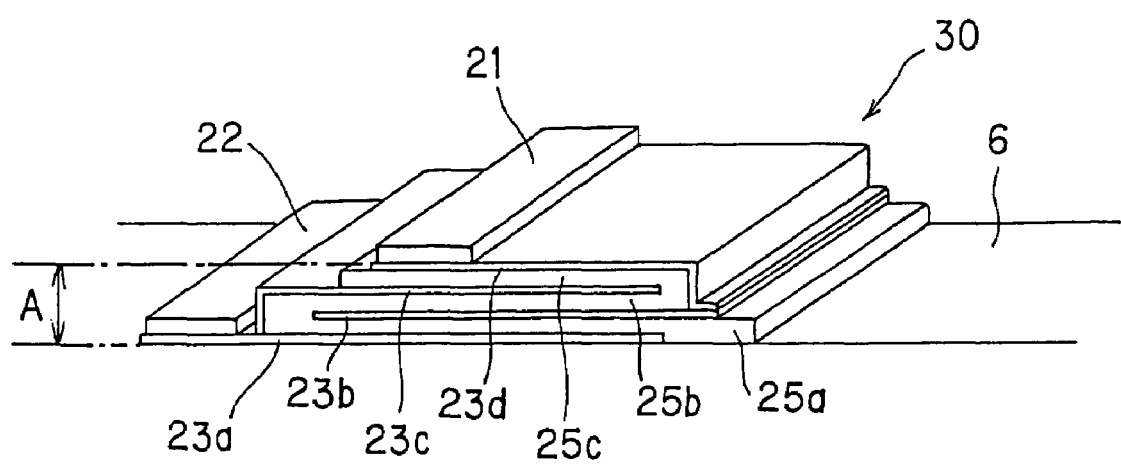
FIG. 3 is a perspective view schematically showing an example of a piezoelectric/electrostrictive element constituting a microswitch of the present invention.

FIG. 3 is a perspective view schematically showing an example of a piezoelectric/electrostrictive element constituting a microswitch of the present invention. In the embodiments of the microswitch of the present invention, preferably, a film piezoelectric/electrostrictive element 30 serving as a bending displacement mechanism is an element composed of a plurality of voltage application electrode layers 23a, 23b, 23c, and 23d and a plurality of piezoelectric/electrostrictors 25a, 25b, and 25c which are alternately stacked so that each piezoelectric/electrostrictor is held between voltage application electrode layers, as shown in FIG. 3, that is, the piezoelectric/electrostrictive element 30 has a multilayer structure. The piezoelectric/electrostrictive element 30 having such a multilayer structure has a large driving force and, thereby, can cause a large displacement of the front-end portion of the thin plate 6 provided with the movable electrode. Furthermore, since the rigidity of the microswitch itself can be increased, the resonant frequency can be made high, and the displacement operation can be performed at a higher speed.

When the number of piezoelectric/electrostrictors and the number of voltage application electrode layers are increased, the driving force of the piezoelectric/electrostrictive element is increased. However, the electric power consumption is increased correspondingly. Therefore, the number of layers to be stacked is appropriately set in accordance with purposes and operating conditions. Specifically, the number of piezoelectric/electrostrictive layers is preferably 10 or less, and more preferably is 5 or less.

In the example shown in FIG. 3, the piezoelectric/electrostrictors 25*a*, 25*b*, and 25*c* constitute a three-layer structure. Four voltage application electrode layers 23*a*, 23*b*, 23*c*, and 23*d* are disposed, and every two electrode layers form a pair of comb-shaped electrode pair. In this case, the voltage application electrode layers 23*a* and 23*c* are joined to each other and the voltage application electrode layers 23*b* and 23*d* are joined to each other to have commonality and, thereby, the number of terminals 21 and 22 can be decreased. Consequently, the upsizing of the piezoelectric/electrostrictive element 30 in accordance with the increase in the number of layers can be suppressed.

The ceramic constituting the thin plate of the embodiments of the microswitch of the present invention is not specifically limited as long as the ceramic has appropriate spring characteristics and rigidity. Preferably, ceramic suitable for application of a method for stacking ceramic green sheets described below is used. Specific examples thereof include materials containing zirconium oxide, e.g., stabilized zirconia and partially stabilized zirconia, magnesium oxide, silicon nitride, aluminum nitride, titanium oxide, spinel, and mullite as a primary component, and materials containing mixtures of them as a primary component. However, a material containing zirconium oxide, in particular, stabilized zirconia, as a primary component and a material containing partially stabilized zirconia as a primary component are preferable since high mechanical strength and high toughness are exhibited even when the thickness is reduced. The ceramic constituting the thin plate may be piezoelectric ceramic described below. Even the piezoelectric ceramic performs the function as a structural material as long as the piezoelectric ceramic is in an inactive state in which no voltage application electrode layer is included. Therefore, the piezoelectric ceramic can be used for the thin plate.

Figure 8B:
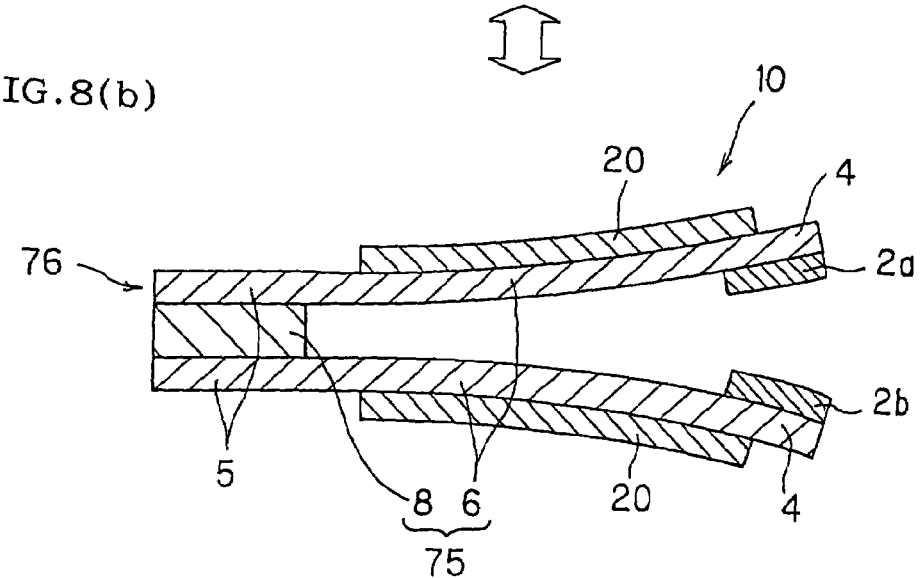

The thin plate 6 is a thin sheet-shaped component having flexibility, and has the function of amplifying the expansion and contraction displacement of piezoelectric/electrostrictive element 20 disposed on the surface while converting to a bending displacement and, thereby, displacing the front-end portion 4 provided with the movable electrode 2 (refer to FIG. 2(*b*) and FIG. 8(*b*)). Therefore, the shape and the material of the thin plate 6 are good enough as long as the flexibility is exhibited and the mechanical strength is such a degree that the thin plate 6 is not damaged by the bending displacement, and can be appropriately selected in consideration of the responsiveness and the operability of the front-end portion 4.

Preferably, zirconia is stabilized or partially stabilized (stabilized or partially stabilized zirconia), as described below. Examples of compounds which stabilize or partially stabilize zirconia may include yttrium oxide, ytterbium oxide, cerium oxide, calcium oxide, and magnesium oxide. At least one of these compounds is added to zirconia and, thereby, the target zirconia can be stabilized or partially stabilized.

Preferably, the quantity of addition of yttrium oxide or ytterbium oxide is 1 to 30 percent by mole, and more preferably is 1.5 to 10 percent by mole. Preferably, the quantity of addition of cerium oxide is 6 to 50 percent by mole, and more preferably is 8 to 20 percent by mole. Preferably, the quantity of addition of calcium oxide or magnesium oxide is 5 to 40 percent by mole, and more preferably is 5 to 20 percent by mole. It is particularly preferable to use yttrium oxide as a stabilizer among these compounds. Preferably, 1.5 to 10 percent by mole of yttrium oxide is added, and more preferably, 2 to 4 percent by mole of yttrium oxide is added. Furthermore, alumina, silica, transition metal oxides, and the like may be added as adhesives, e.g., sintering accelerator, at within the range of 0.05 to 20 percent by mass.

Preferably, the average crystal grain diameter of zirconia is specified to be 0.05 to 3 µm in order to ensure adequate mechanical strength of the thin plate and to stabilize the crystal phase, and more preferably be 0.05 to 1 µm. The thin plate and the support portion may be constructed by using different ceramic. However, it is preferable that the two are constructed by using substantially the same ceramic in order to ensure the reliability of the joint portion of them and the strength of the entire microswitch and to reduce the complication in production.

The piezoelectric/electrostrictive element 20 includes at least the piezoelectric/electrostrictor and a pair of the voltage application electrode layers to apply a voltage to this piezoelectric/electrostrictor, and a piezoelectric/electrostrictive element of unimorph type, bimorph type, or the like may be used. However, the unimorph type piezoelectric/electrostrictive element in combination with the thin plate exhibits excellent stability in the quantity of displacement generated and is advantageous for weight reduction. As shown in FIGS. 2(*a*) and (*b*), and FIGS. 8(*a*) and (*b*), it is preferable that the piezoelectric/electrostrictive element 20 is disposed on a side surface of the thin plate 6 since the front-end portion 4 of the thin plate 6 can be displaced to a greater degree.

Piezoelectric ceramic is suitable for use as the material for constituting the piezoelectric/electrostrictive layer of the piezoelectric/electrostrictive element. In addition, electrostrictive ceramic, ferroelectric ceramic, or antiferroelectric ceramic may be used. However, since the linearity between the quantity of displacement of the front-end portion and the driving voltage or the output voltage is important, it is preferable that a material having a small strain history is used. Preferably, a material having a coercive electric field of 10 kV/mm or less is used.

Specific examples of materials constituting the piezoelectric/electrostrictive layer of the piezoelectric/electrostrictive element include ceramic containing lead zirconate, lead titanate, lead magnesium niobate, lead nickel niobate, lead zinc niobate, lead manganese niobate, lead antimony stannate, lead manganese tungstate, lead cobalt niobate, barium titanate, sodium bismuth titanate, potassium sodium niobate, strontium bismuth tantalate, or the like alone or as a mixture. In particular, a material containing lead zirconate, lead titanate, or lead magnesium niobate as a primary component or a material containing sodium bismuth titanate as a primary component is used preferably, since a high electromechanical coupling coefficient and a high piezoelectric constant are exhibited, the reactivity of the piezoelectric/ electrostrictive layer with the thin plate during the sintering is small, and a stable composition can be attained.

Furthermore, an oxide or the like of lanthanum, calcium, strontium, molybdenum, tungsten, barium, niobium, zinc, nickel, manganese, cerium, cadmium, chromium, cobalt, antimony, iron, yttrium, tantalum, lithium, bismuth, tin, or the like may be added alone or a mixture of these oxides may be added to the above-described material constituting the piezoelectric/electrostrictive layer of the piezoelectric/electrostrictive element. For example, in some cases, when an oxide of lanthanum, strontium, or the like is contained in a primary component, i.e. lead zirconate, lead titanate, or lead magnesium niobate, there are advantages that the coercive electric field and the piezoelectric characteristics become controllable and so on.

However, it is desirable to avoid addition of a material which tends to vitrify, e.g., silica, to the material constituting the piezoelectric/electrostrictive layer of the piezoelectric/electrostrictive element. This is because the material, such as silica, tends to react with a piezoelectric/electrostrictive material during a heat treatment of the piezoelectric/electrostrictive layer, the composition of the piezoelectric/electrostrictive material may be varied, and the piezoelectric characteristics may be deteriorated.

Preferably, the voltage application electrode layer constituting the piezoelectric/electrostrictive element is composed of a metal which is solid at room temperature and which has excellent electrical conductivity. For example, a simple substance of metal, e.g., aluminum, titanium, chromium, iron, cobalt, nickel, copper, zinc, niobium, molybdenum, ruthenium, palladium, rhodium, silver, tin, tantalum, tungsten, iridium, platinum, gold, or lead, or an alloy thereof is used preferably. Alternatively, a cermet material may be used, in which the same material as the material constituting the piezoelectric/electrostrictor or the thin plate is dispersed in the simple substance of metal or the alloy. On the other hand, it is also preferable that the voltage application electrode layer is composed of ruthenium oxide or iridium oxide since the effect of improving the durability of the piezoelectric/electrostrictive material is exerted.

The selection of the material for the electrode (voltage application electrode layer) constituting the piezoelectric/electrostrictive element is determined depending on a method for forming the piezoelectric/electrostrictor. For example, in the case where one electrode is formed on the thin plate and, thereafter, the piezoelectric/electrostrictor is formed by firing on this electrode, the material constituting the above-described electrode must be a high-melting point metal, e.g., platinum, palladium, a platinum-palladium alloy, or a silver-palladium alloy, which is not varied even at a temperature (firing temperature) required for forming the piezoelectric/electrostrictor by firing. On the other hand, the material constituting other electrodes serving as an outermost layer formed on the piezoelectric/electrostrictor after the piezoelectric/electrostrictor is formed on the thin plate may contain low-melting point metal, e.g., aluminum, gold, or silver, as a primary component since the electrode can be formed at a temperature lower than the above-described firing temperature.

The thickness of the electrode is no small factor responsible for varying the quantity of displacement of the piezoelectric/electrostrictive element. In particular, it is preferable that the material constituting the electrode formed after firing of the piezoelectric/electrostrictor is a material, e.g., organometallic pastes, which provide a dense and thinner film after firing and, therefore, a gold resinate paste, a platinum resinate paste, a silver resinate paste, or the like is used.

An embodiment of the method for manufacturing a microswitch of the present invention will be specifically described below. Here, definition of terms will be described. A laminate produced by stacking ceramic green sheets is defined as a ceramic green laminate 58 (for example, refer to FIG. 10). A structure produced by firing this ceramic green laminate 58 to integrate is defined as a ceramic structure 60 (for example, refer to FIG. 11).

Figure 9:
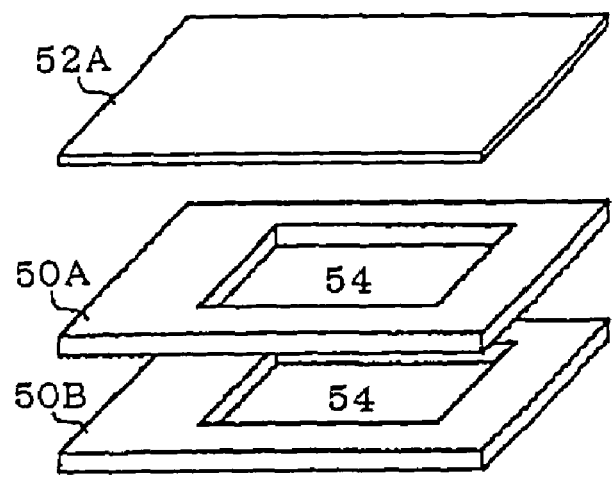
FIG. 9 is an explanatory diagram showing a process for stacking green ceramic sheets.

A slurry is prepared by mixing a ceramic powder, e.g., zirconia, with a binder, a solvent, a dispersing agent, a plasticizer, and the like. The resulting slurry is subjected to a deaeration treatment and, thereafter, ceramic green sheets having a predetermined thickness are prepared by a reverse roll coater method, a doctor blade method, or the like. Subsequently, the ceramic green sheets are processed into various shapes, as shown in FIG. 9, by a method, e.g., punching through the use of a mold and laser processing, so that a plurality of ceramic green sheets 50A, 50B, and 52A to form a substrate are produced.

Figure 10:
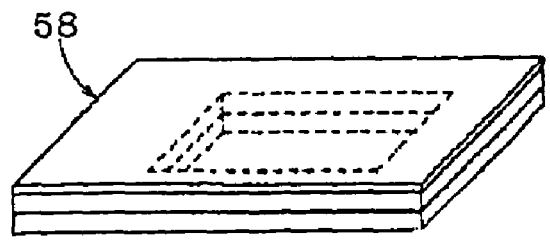
FIG. 10 is an explanatory diagram showing a green ceramic laminate.

These ceramic green sheets 50A, 50B, and 52A are classified into at least a plurality of (for example, two sheets) ceramic green sheets 50A and 50B, each provided with a window portion 54, and a ceramic green sheet 52A to become the thin plate. The number of the ceramic green sheets is no more than an example. Subsequently, as shown in FIG. 10, the ceramic green sheets 50A, 50B, and 52A are stacked and pressure-bonded to form the ceramic green laminate 58. The resulting ceramic green laminate 58 is fired and, thereby, the ceramic structure 60 (refer to FIG. 11) is produced (the first step).

The number of pressure bonding and the order for stacking and integration are not specifically limited, and may be appropriately determined depending on, for example, the shape of the window portion 54 and the number of the ceramic green sheets in order to attain a desired structure. All shapes of window portions 54 are not necessarily the same, and may be appropriately determined. The number of the ceramic green sheets and the thickness of each ceramic green sheet are not specifically limited as well.

The stacking property can be more improved by adding heat to the pressure bonding. The stacking property at the ceramic green sheet interface can be improved by applying or printing a paste, a slurry, or the like primarily containing a ceramic powder (preferably, the composition is equal or similar to the composition of the ceramic used for the ceramic green sheet in order to ensure the reliability) and a binder to the ceramic green sheet so that a supplemental joint layer is provided. In the case where the ceramic green sheet 52A is thin, it is preferable to treat by using plastic films, most of all, a polyethylene terephthalate film with a surface coated with a silicone-based mold release agent.

Figure 11:
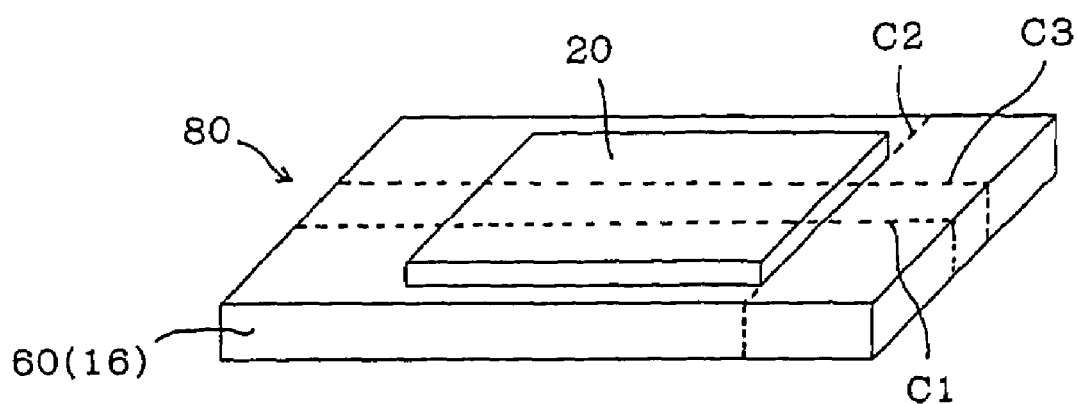
FIG. 11 is an explanatory diagram showing a state in which a piezoelectric/electrostrictive element is disposed on a ceramic structure.

As shown in FIG. 11, a piezoelectric/electrostrictive element 20 (bending displacement mechanism) including a film piezoelectric/electrostrictor and voltage application electrode layers is formed on one surface of the ceramic structure 60, that is, on a surface corresponding to a surface on which the ceramic green sheet 52A has been stacked, so that a bending displacement mechanism unit 80 is prepared (the second step). A thick film forming method, e.g., a screen printing method, a dipping method, a coating method, or an electrophoresis method, may be used as a method for forming the piezoelectric/electrostrictive element 20. Since the piezoelectric/electrostrictive element 20 is formed by using such a thick film forming method, and the piezoelectric/electrostrictive element 20 can be disposed and integrated with the thin plate 6 by firing without using any adhesive, the reliability and the reproducibility can be ensured and, in addition, higher integration can be readily achieved.

In particular, when the piezoelectric/electrostrictor is formed by using the thick film forming method, the piezoelectric/electrostrictor can be formed by using a paste, a slurry, a suspension, an emulsion, a sol, or the like, each containing piezoelectric ceramic particles or powder having an average particle diameter of 0.01 to 5 μm, and preferably of 0.05 to 3 μm as primary components, and excellent piezoelectric/electrostrictive characteristics can be attained by firing. The electrophoresis method has an advantage that a film having a high density can be formed with high precision of shape. The screen printing method is advantageous for simplifying the manufacturing process since the film formation and the pattern formation can be performed simultaneously.

A method for forming the piezoelectric/electrostrictive element 20 will be specifically described. The ceramic green laminate 58 is fired and integrated at a temperature of 1,200° C. to 1,600° C. and, thereby, the ceramic structure 60 is produced (the first step). One voltage application electrode layer is printed at a predetermined position of the top surface of the resulting ceramic structure 60, followed by firing. Subsequently, a film piezoelectric/electrostrictor is printed, followed by firing. Furthermore, the other voltage application electrode layer, which is paired up with the above-described voltage application electrode layer, is printed, followed by firing. These operations are repeated predetermined times (that is, in the case where the piezoelectric/electrostrictive element 20 has a multilayer structure), so that the piezoelectric/electrostrictive element 20 is formed. Thereafter, a terminal (not shown in the drawing) to electrically connect each of electrode layers to a driving circuit is printed, followed by firing.

When the materials of components are selected so that the firing temperatures of respective components are lowered in the order of the stacking, for example, platinum (Pt) is used for one voltage application electrode layer, lead zirconate titanate (PZT) is used for the piezoelectric/electrostrictor, gold (Au) is used for the other voltage application electrode layer, and silver (Ag) is used for the terminal, in any step of firing, re-sintering of the material fired in the upstream process does not occur. Consequently, occurrence of problems, e.g., peeling of the voltage application electrode layer and the like and coagulation, can be avoided. By selecting appropriate materials, it is also possible that each component and each terminal constituting the piezoelectric/electrostrictive element 20 are printed sequentially, and all components and terminals are integrated by firing at a time. Alternatively, it is possible that the outermost piezoelectric/electrostrictor is formed and, thereafter, the outermost electrode layer is disposed at a low temperature.

In the formation of the piezoelectric/electrostrictive element, it is also preferable that the piezoelectric/electrostrictive element is formed beforehand on the top surface of the ceramic green laminate 58 (refer to FIG. 10), and the resulting ceramic green laminate 58 and the piezoelectric/electrostrictive element are fired simultaneously. With respect to the simultaneous firing, examples of methods may include a method in which the ceramic green laminate 58 and all constituent layers (voltage application electrode layers and a piezoelectric/electrostrictor) of the piezoelectric/electrostrictive element are fired, a method in which one voltage application electrode layer and the ceramic green laminate 58 are fired simultaneously, and a method in which the ceramic green laminate 58 and the constituent layers except for the other voltage application electrode layer are fired simultaneously.

Examples of methods for simultaneously firing the piezoelectric/electrostrictive element and the ceramic green laminate 58 (refer to FIG. 10) include a method in which a precursor of the piezoelectric/electrostrictor is formed by, e.g., a tape molding method through the use of a slurry as a raw material, and this unfired precursor of the piezoelectric/electrostrictor is stacked on a surface of the ceramic green laminate 58 by a thermocompression method or the like, followed by simultaneous firing, so that the thin plate, the support portion, and the piezoelectric/electrostrictor are prepared simultaneously. Alternatively, the voltage application electrode layers and the piezoelectric/electrostrictor, each being a constituent layer of the piezoelectric/electrostrictive element, may be formed by screen printing on at least a portion to finally become the thin plate of the ceramic green laminate 58, followed by simultaneous firing.

The firing temperatures of the constituent layers of the piezoelectric/electrostrictive element 20 (refer to FIG. 11) are appropriately determined depending on the respective materials constituting them. In general, the firing temperatures are 500° C. to 1,500° C. Preferably, the piezoelectric/electrostrictor is fired at 1,000° C. to 1,400° C. In order to control the composition of the piezoelectric/electrostrictor, preferably, sintering is performed in the presence of the evaporation source of the material for the piezoelectric/electrostrictor. In the case where the piezoelectric/electrostrictor and the ceramic green laminate 58 are fired simultaneously, the firing conditions of the two must be agreed with each other.

Figure 12:
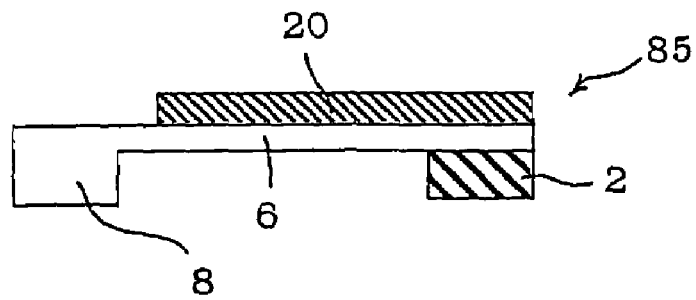
FIG. 12 is a side view showing an example of a movable electrode unit.

As shown in FIG. 11 and FIG. 12, the bending displacement mechanism unit 80 is cut along cutting-plane lines C1 to C3 to eliminate unnecessary portions. The movable electrode 2 is disposed on the front-end portion of the thin plate 6, so that a movable electrode unit 85 is prepared (the third step). The positions of cutting are side portions of the ceramic structure 60, in particular, portions where the notch portion due to the window 54 (refer to FIG. 9) is formed on the side surface of the ceramic structure 60 by the cutting (cutting-plane lines C1 to C3 in FIG. 11).

Examples of methods adaptable for the cutting include mechanical processing methods, e.g., a dicing processing method and a wire saw processing method; laser processing methods by using a YAG laser, an excimer laser, and the like; and electron beam processing methods. These processing methods may be combined.

With respect to the cutting along the cutting-plane lines C1 to C3 shown in FIG. 11, preferably, a heat treatment is performed at 300° C. to 800° C. after the cutting. This is because defects, e.g., microcracks, may tend to occur in the ceramic substrate 16 due to the cutting process, but these defects can be eliminated by performing the heat treatment and, thereby, the reliability is improved. Furthermore, it is preferable to perform an aging treatment through standing at about 80° C. for at least about 10 hours after this heat treatment. This is because the aging treatment can relieve various stresses and the like generated during the manufacturing process, and contributes to improvement of characteristics. The movable electrode 2 shown in FIG. 12 can be prepared by bonding a component provided with an electrode layer to an insulating substrate.

As shown in FIG. 1, fixed electrodes 3a and 3b to become signal line electrode layers are formed with a desired pattern on an insulating substrate, so that the substrate 7 (wiring board) is prepared (the fourth step). A support portion 8 of the movable electrode unit 85 (refer to FIG. 12) prepared in the third step is disposed at a predetermined position on this substrate 7 by a suitable bonding method, so that the microswitch 1 (refer to FIG. 1) of the present invention can be produced (the fifth step). Examples of the insulating substrate constituting the substrate 7 may include those made of quartz, SOI wafers, and the like. Preferably, the signal line electrode layers are formed on the substrate 7 by a vacuum film forming process and photolithography, since precise patterning can be performed. Examples of bonding methods for fixing the support portion 8 to the substrate 7 may include a method in which an adhesive, e.g., a thermosetting resin adhesive, is used.

Figure 13A:
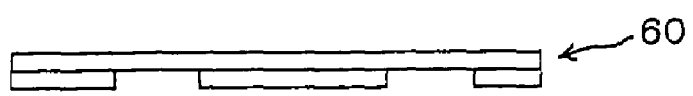
FIG. 13(a) is an explanatory diagram showing a ceramic structure
Figure 13B:
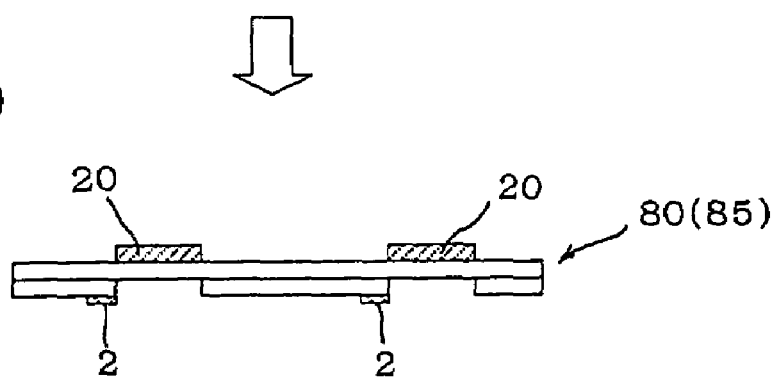
FIG. 13(b) shows a state in which a piezoelectric/electrostrictive element 20 is formed on the ceramic structure shown in FIG. 13(a).
Figure 13C:
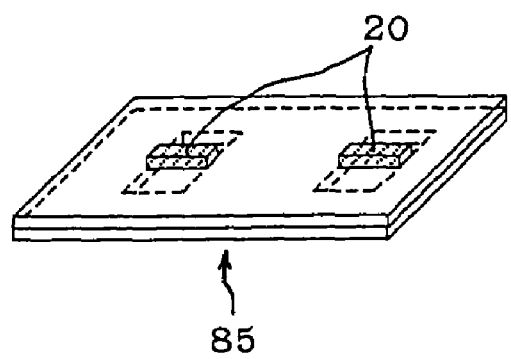
FIG. 13(c) is a perspective view showing an example of a movable electrode unit.

Another embodiment of the method for manufacturing a microswitch of the present invention will be specifically described below. In a manner similar to that in the above-described embodiment of the method for manufacturing a microswitch, a ceramic structure 60 in a predetermined shape as shown in FIG. 13(*a*) is prepared (the first step). By using the resulting ceramic structure 60, a bending displacement mechanism unit 80 provided with a piezoelectric/electrostrictive element 20 (bending displacement mechanism) (refer to FIG. 13(*b*)) is prepared (the second step). A movable electrode 2 is disposed at a predetermined portion of this bending displacement mechanism unit 80, so that a movable electrode unit 85 (refer to FIG. 13(*c*)) is prepared (the third step).

Figure 14A:
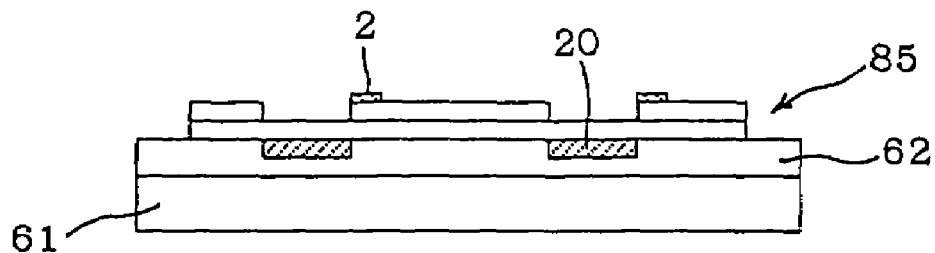
FIGS. 14(a) and (b) are an explanatory diagram showing how a movable electrode unit is processed.
Figure 14B:
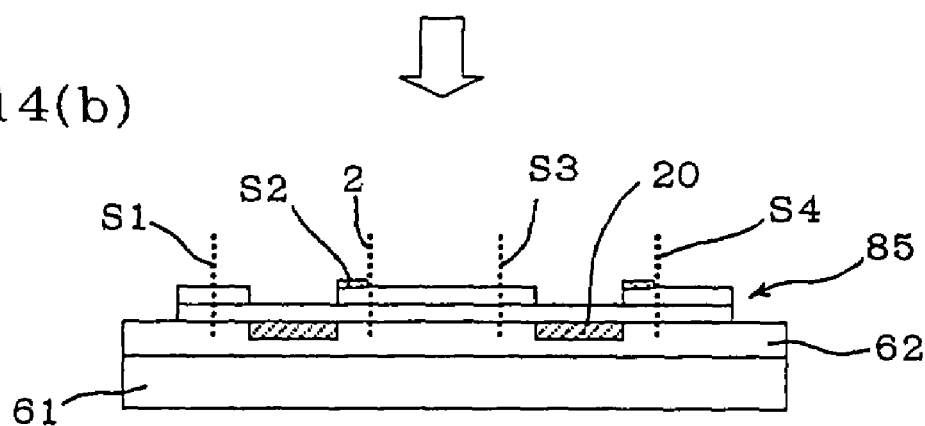
FIG. 14(b) is given to show which portions are removed during the processing.
Figure 14C:
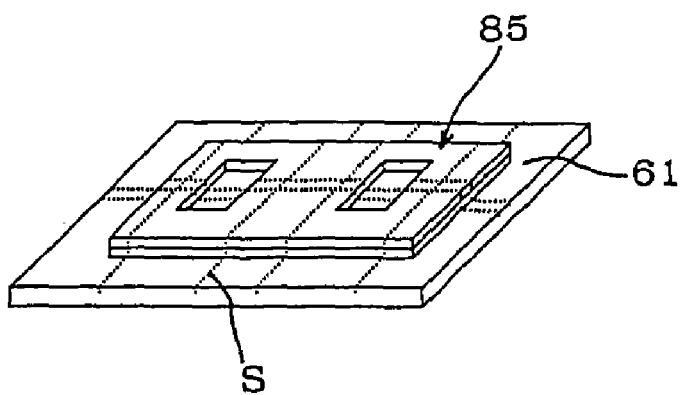
FIG. 14(c) is a perspective view showing a state in which a movable electrode unit is disposed on a temporary fixing substrate.
Figure 15A:
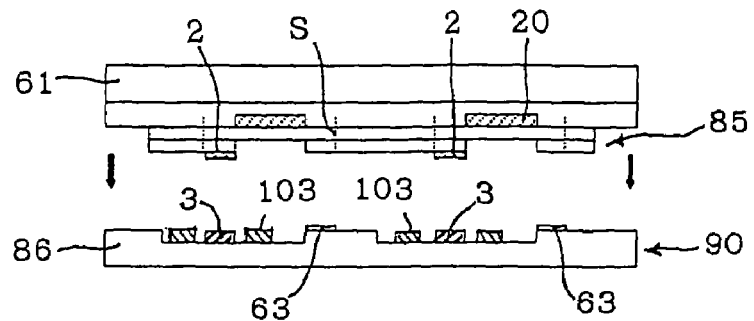
FIGS. 15(a) to (d) is an explanatory diagram showing the respective major steps of a process for producing a microswitch precursor.
Figure 15B:
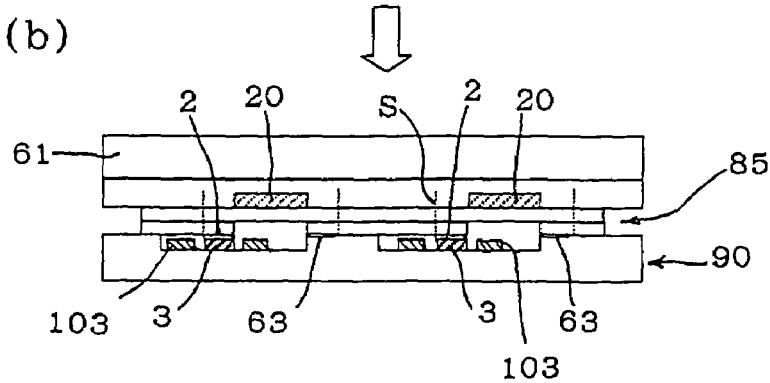
Figure 15C:
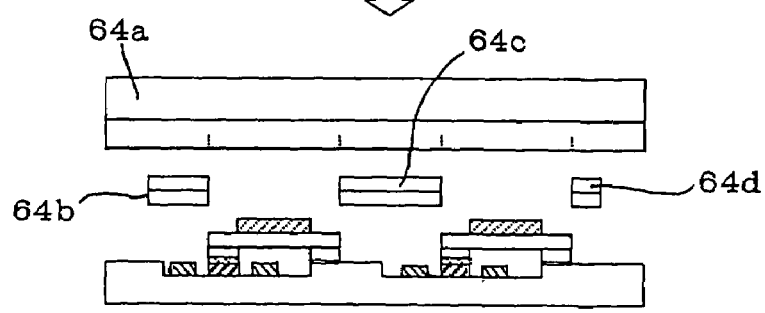
Figure 15D:
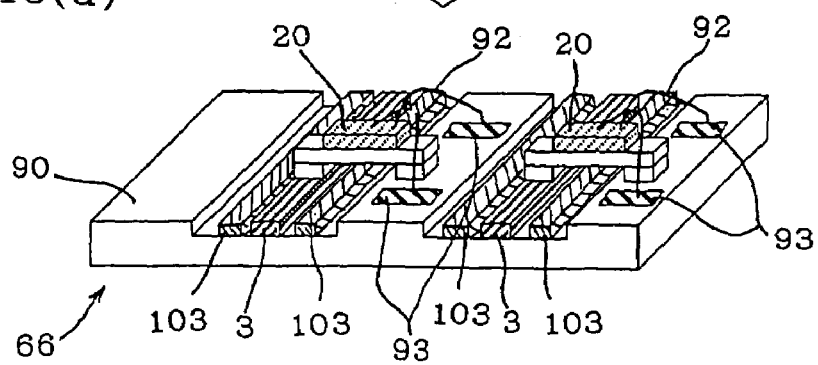

As shown in FIGS. 14(*a*) and (*b*), preferably, the resulting movable electrode unit 85 in the state of being flipped vertically is temporarily fixed to a temporary fixing substrate 61 having an appropriate size with a temporary fixing adhesive layer 62 capable of being attached and detached from the viewpoint of an improvement in the efficiency of downstream operation. This temporary fixing adhesive layer 62 can be composed of, for example, an ultraviolet curing adhesive or a thermally expanded sheet. Subsequently, as shown in FIG. 14(*b*) and FIG. 14(*c*), several portions are slit along cut-in lines S1 to S4 (S) so that unnecessary portions are eliminated in a downstream operation to produce a microswitch in a predetermined shape. In the method for manufacturing a microswitch of the present invention, after the movable electrode unit 85 is prepared, the resulting movable electrode unit 85 is temporarily fixed to the temporary fixing substrate 61 and is processed by slitting. Consequently, only the movable electrode unit 85 is split, the temporary fixing substrate 61 is not split. As a result, these are held without coming apart, the arrangement pitch of an individual piezoelectric/electrostrictive element 20 is kept with precision of mechanical processing and, thereby, high-precision mounting can be performed. If the movable electrode unit 85 is split, problems may occur in that, for example, the piezoelectric/electrostrictive element 20 is damaged or becomes dirty and the mounting precision is reduced. According to the method for manufacturing a microswitch of the present invention, the above-described problems can be avoided. That is, the method for manufacturing a microswitch of the present invention is characterized in that the movable electrode unit 85 provided with piezoelectric/electrostrictive elements 20 arranged in accordance with a multi-forming process is not split on an individual basis, but is mounted by one operation.

As shown in FIGS. 15(*a*) to (*d*), the movable electrode unit 85 is disposed on a wiring board 90 in which fixed electrodes 3 serving as signal line electrode layers and fixed electrodes 103 serving as grounding electrode layers are disposed with a predetermined pattern on an insulating substrate 86 (the fourth step), while alignment is performed so that the movable electrode 2 and the fixed electrode 3 are brought into contact with each other. Preferably, an appropriate adhesive is applied to portions to become support portions of the microswitch to be produced, and the movable electrode unit 85 is disposed on the wiring board 90. After the movable electrode unit 85 is disposed on the wiring board 90, the temporary fixing adhesive layer 62 is eliminated by peeling off and, in addition, unnecessary portions 64*a* to 64*d* are eliminated, so that a microswitch precursor 66 is produced. The voltage application electrode layers constituting the piezoelectric/electrostrictive element 20 and the piezoelectric/electrostrictive element driving electrodes 93 may be connected to each other by wire bonding 92 or the like, so that an external power source (not shown in the drawing) may be ensured.

Figure 16A:
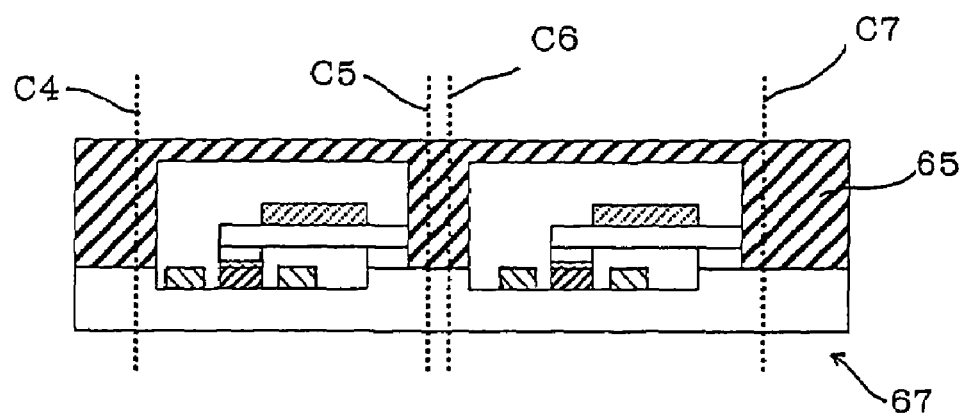
FIGS. 16(a) to (b) show an explanatory diagram showing a process for producing a microswitch by cutting processing.
Figure 16B:
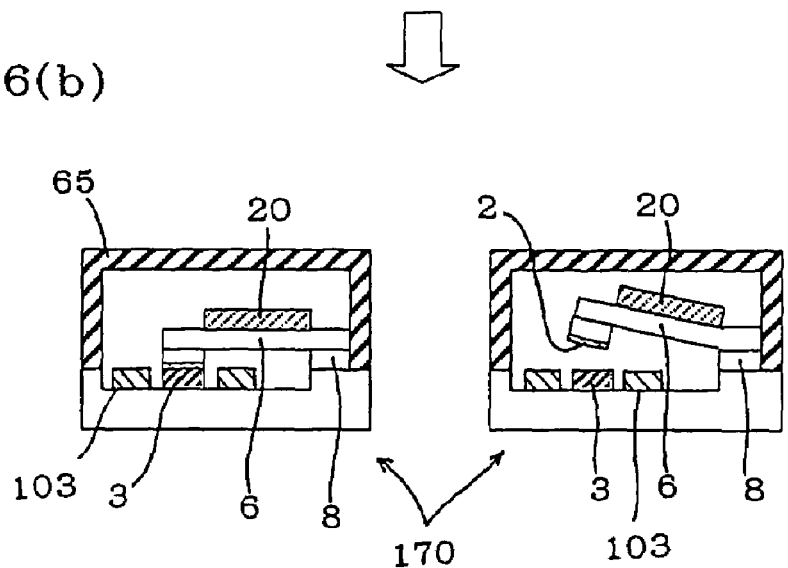

The resulting microswitch precursor 66 (refer to FIG. 15(*d*)) may be provided with a sealing substrate 65 shown in FIG. 16(*a*), so that a microswitch precursor 67 may be produced. By using the above-described sealing substrate 65, an individually sealed microswitch module can be prepared. The microswitch precursor 67 is split by cutting along, for example, cutting-plane lines C4 to C7 and, thereby, a plurality of microswitches 170 (two switches in FIG. 16(*b*)) according to the embodiment of the present invention can be produced (the fifth step). The sizes of the wiring board 90 and the movable electrode unit 85 can be arbitrarily set depending on the sizes of the insulating substrate and the ceramic green sheets to be used. Therefore, the method for manufacturing a microswitch of the present invention is a manufacturing method suitable for a so-called multi-forming process in which a plurality of microswitches 170 of the present invention can be produced in one operation by appropriately setting the materials to be used and the sizes of components and performing the first step to the fifth step only once. Consequently, it can be said that the above-described manufacturing method has extremely high production efficiency.

Figure 17A:
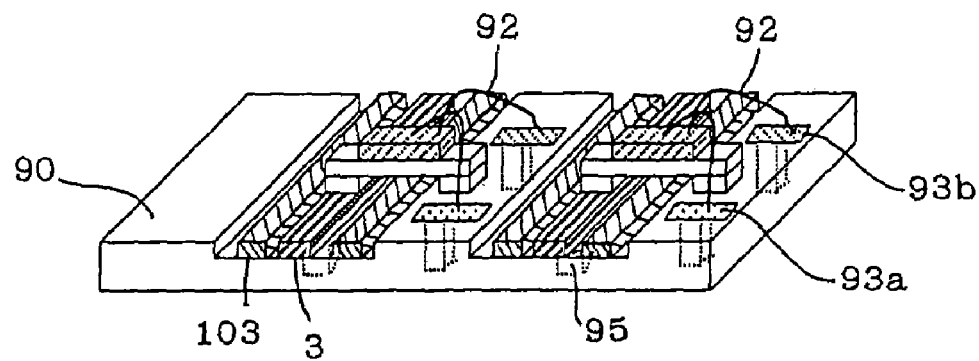
FIG. 17(a) is a perspective view showing an example of a microswitch precursor.
Figure 17B:
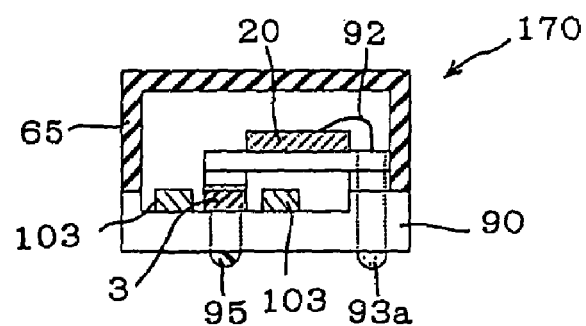
FIG. 17(b) is a sectional view schematically showing another embodiment of the first microswitch of the present invention.
Figure 17C:
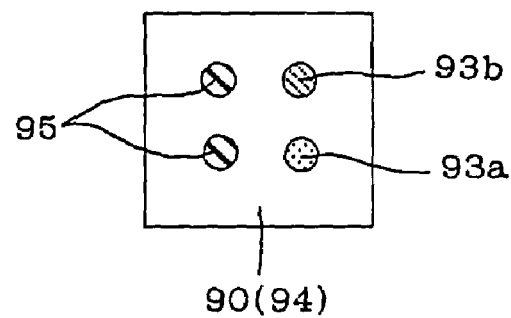
FIG. 17(c) is a bottom view of the microswitch shown in FIG. 17(b).

A high-frequency printed board may be adopted as the wiring board. That is, since the high-frequency printed board can be prepared through a stacking process by using ceramic green sheets or the like, the fixed electrode 95 and the piezoelectric/electrostrictive element driving electrodes 93*a*, 93*b*, and 93*c* can be lead to the bottom surface 94 side of the wiring board, as shown in FIG. 17(*a*) to FIG. 17(*c*). Therefore, the microswitch 170 packaged with the sealing substrate 65, as described above, according to the present embodiment can be handled individually, and be directly mounted on a predetermined circuit board individually, so that extremely high practicality is exhibited.

The microswitch of the present invention can efficiently switch high-frequency signals at a low power consumption and has excellent responsiveness, excellent durability, and high reliability of long term driving. Therefore, the microswitch is suitable as compact high-frequency switches used for cellular phones and other portable communications equipment.

What is claimed is:
1. A microswitch comprising:
a movable electrode contact component including a bending displacement component and a movable electrode, the bending displacement component having a thin plate and at least one support portion joined to a rear-end portion of the thin plate, wherein the thickness of the thin plate is 2 µm to 200 µm and the length of the thin plate from the rear-end portion thereof to a front-end portion thereof is 0.2 mm to 10 mm;

a bending displacement mechanism disposed on at least one surface of the thin plate and having a film piezoelectric/electrostrictor and at least one pair of voltage application electrode layers, wherein the thickness of the film piezoelectric/electrostrictor is 2 μm to 200 μm;

a substrate joined to the support portion of the movable electrode contact component and having a fixed electrode disposed on the surface thereof, the fixed electrode facing the movable electrode, wherein the bending displacement mechanism is driven to displace the movable electrode, so that the movable electrode and the fixed electrode can be brought into a state of being electrically connected to each other or disconnected from each other, wherein at least the thin plate of the bending displacement component is made of zirconium oxide, and the thin plate, the piezoelectric/electrostrictor, and the voltage application electrode layers are integrated by firing, and wherein the fixed electrode is constructed as a signal line conductor and the movable electrode is constructed as a grounding conductor, so that the function of the microswitch is performed by bringing the movable electrode and the fixed electrode into a state of being electrically connected to each other or disconnected from each other in order to cause a short circuit between the signal line and the grounding line or not to cause a short circuit.

2. The microswitch according to claim 1, wherein the fixed electrode comprises two fixed electrodes a and b, which are produced by splitting, and is constructed as a signal line conductor, so that the function of the microswitch is performed by bringing the movable electrode and the two fixed electrodes a and b into a state of being electrically connected to each other or disconnected from each other in order to bring the signal line into conduction or out of conduction.

3. The microswitch according to claim 1, wherein the voltage application electrode layer comprises one metal selected from the group consisting of platinum, gold, silver, palladium, aluminum, titanium, chromium, iron, nickel, cobalt, copper, zinc, niobium, molybdenum, ruthenium, tantalum, tungsten, and iridium or an alloy comprising a combination of at least two of them.

4. The microswitch according to claim 1, wherein the voltage application electrode layer comprises ruthenium oxide or iridium oxide.

5. The microswitch according to claim 1, wherein the piezoelectric/electrostrictor comprises at least one ceramic selected from the group consisting of lead zirconate, lead titanate, lead magnesium niobate, lead nickel niobate, lead zinc niobate, lead manganese niobate, lead antimony stannate, lead manganese tungstate, lead cobalt niobate, barium titanate, sodium bismuth titanate, potassium sodium niobate, and strontium bismuth tantalate.

6. The microswitch according to claim 1, wherein the bending displacement mechanism comprises a plurality of voltage application electrode layers and a plurality of piezoelectric/electrostrictors which are alternately stacked so that each piezoelectric/electrostrictor is held between voltage application electrode layers.

7. A microswitch comprising:

a movable electrode component including a bending displacement component composed of a thin plate and a movable electrode;

a bending displacement mechanism disposed on at least one surface of the thin plate and having a film piezoelectric/electrostrictor and at least one pair of voltage application electrode layers, wherein the thickness of the film piezoelectric/electrostrictor is 2 μm to 200 μm;

a substrate joined to one end portion of the thin plate of the movable electrode component and having a fixed electrode disposed on the surface thereof, the fixed electrode facing the movable electrode, wherein the bending displacement mechanism is driven to displace the movable electrode, so that the movable electrode and the fixed electrode can be brought into a state of being electrically connected to each other or disconnected from each other, wherein at least the thin plate of the bending displacement component is made of zirconium oxide, the thickness of the thin plate is 2 μm to 200 μm and the length of the thin plate from a rear-end portion thereof to a front-end portion thereof is 0.2 mm to 10 mm, and the thin plate, the piezoelectric/electrostrictor, and the voltage application electrode layers are integrated by firing, and wherein the fixed electrodes is constructed as a signal line conductor and the movable electrodes is constructed as a grounding conductor, so that the function of the microswitch is performed by bringing the movable electrodes and the fixed electrode into a state of being electrically connected to each other or disconnected from each other in order to cause a short circuit between the signal and the grounding line or not to cause a short circuit.

8. The microswitch according to claim 7, wherein the fixed electrode and the movable electrode are constructed as signal line conductors, so that the function of the microswitch is performed by bringing the movable electrode and the fixed electrode into a state of being electrically connected to each other or disconnected from each other in order to bring the signal line into conduction or out of conduction.

9. A microswitch comprising:

a movable electrode contact component including a bending displacement component and a movable electrode, the bending displacement component having a thin plate and at least one support portion joined to an end portion of the thin plate;

a bending displacement mechanism disposed on at least one surface of the thin plate and having a film piezoelectric/electrostrictor and at least one pair of voltage application electrode layers; and a substrate joined to the support portion of the movable electrode contact component and having a fixed electrode disposed on the surface thereof, the fixed electrode facing the movable electrode, wherein the bending displacement mechanism is driven to displace the movable electrode, so that the movable electrode and the fixed electrode can be brought into a state of being electrically connected to each other or disconnected from each other, wherein at least the thin plate of the bending displacement component is made of a ceramic material, and the thin plate, the piezoelectric/electrostrictor, and the voltage application electrode layers are integrated by firing, and wherein the piezoelectric/electrostrictor is disposed such that at least a portion thereof overlaps the support portion.

* * * * *

UNITED STATES PATENT AND TRADEMARK OFFICE
CERTIFICATE OF CORRECTION

| | |
|---|---|
| PATENT NO. | : 7,372,191 B2 |
| APPLICATION NO. | : 11/091279 |
| DATED | : May 13, 2008 |
| INVENTOR(S) | : Makoto Ohmori and Tatsuo Kawaguchi |

Page 1 of 1

It is certified that error appears in the above-identified patent and that said Letters Patent is hereby corrected as shown below:

<u>Column 26</u>

*Lines 19, 20 and 23*:   please change "electrodes" to --electrode--

Signed and Sealed this

Twenty-sixth Day of August, 2008

JON W. DUDAS
*Director of the United States Patent and Trademark Office*